US011860212B1

(12) United States Patent
Anderson et al.

(10) Patent No.: US 11,860,212 B1
(45) Date of Patent: Jan. 2, 2024

(54) GRID STATUS MONITORING SYSTEM

(71) Applicant: SAS Institute Inc., Cary, NC (US)

(72) Inventors: Thomas Dale Anderson, Peoria, AZ (US); Priyadarshini Sharma, Bellevue, WA (US); Mark Joseph Konya, Innsbrook, MO (US); Yuwei Liao, Cary, NC (US)

(73) Assignee: SAS INSTITUTE INC., Cary, NC (US)

( * ) Notice: Subject to any disclaimer, the term of this patent is extended or adjusted under 35 U.S.C. 154(b) by 0 days.

(21) Appl. No.: 18/214,038

(22) Filed: Jun. 26, 2023

Related U.S. Application Data

(60) Provisional application No. 63/393,332, filed on Jul. 29, 2022, provisional application No. 63/430,328, filed on Dec. 5, 2022.

(51) Int. Cl.
*G01R 31/08* (2020.01)
*G06Q 30/01* (2023.01)
*H02J 13/00* (2006.01)

(52) U.S. Cl.
CPC ........... *G01R 31/086* (2013.01); *G06Q 30/01* (2013.01); *H02J 13/00002* (2020.01)

(58) Field of Classification Search
CPC .. G01R 31/086; G06Q 30/01; H02J 13/00002
See application file for complete search history.

(56) References Cited

U.S. PATENT DOCUMENTS

| 7,577,535 | B2 | 8/2009 | Anderson et al. |
| 7,912,660 | B2 | 3/2011 | Anderson et al. |
| 10,209,291 | B2 | 2/2019 | Sozer et al. |
| 11,217,349 | B2 | 1/2022 | Sherkat et al. |
| 11,307,570 | B2 | 4/2022 | Trinh et al. |
| 11,321,581 | B2 | 5/2022 | Cha et al. |
| 11,322,976 | B1 | 5/2022 | Anderson et al. |
| 2007/0129836 | A1* | 6/2007 | Hendler ............. G05B 23/0281 700/110 |

(Continued)

OTHER PUBLICATIONS

SAS Institute Inc. 2019, "SAS® Lineage 3.3: User's Guide" pp. 1-42, Jun. 7, 2019.

(Continued)

*Primary Examiner* — Farhana A Hoque
*Assistant Examiner* — Joseph O Nyamogo
(74) *Attorney, Agent, or Firm* — Bell & Manning, LLC

(57) ABSTRACT

A computer monitors a status of grid devices using sensor measurements. Sensor data is clustered using a predefined grouping distance value to define one or more sensor event clusters. A plurality of monitored devices is clustered using a predefined clustering distance value to define one or more asset clusters. A location is associated with each monitored device of the plurality of monitored devices. A distance is computed between each sensor event cluster and each asset cluster. When the computed distance is less than or equal to a predefined asset/sensor distance value for a sensor event cluster and an asset cluster, an asset identifier of the asset cluster associated with the computed distance is added to an asset event list. For each asset cluster included in the asset event list, an asset location of an asset is shown on a map in a graphical user interface presented in a display.

30 Claims, 13 Drawing Sheets
(5 of 13 Drawing Sheet(s) Filed in Color)

(56) References Cited

U.S. PATENT DOCUMENTS

2008/0084283 A1\* 4/2008 Kalik .................... B60Q 9/00
                                                    701/301
2021/0307189 A1\* 9/2021 Lucero ................. H05K 1/141

OTHER PUBLICATIONS

Exacter, Trekker Edge Computing Sensors on Garbage Trucks Are Monitoring the Grid & Providing Machine Learning Analytics for Improved Reliability, https://www.exacterinc.com/trekker-garbage-truck-project, pp. 1-4, downloaded Nov. 20, 2022.
SAS Institute Inc., "SAS® 9.4 Functions and CALL Routines: Reference, Fifth Edition" pp. 1-1672, Aug. 15, 2022.
SAS Institute Inc., "SAS/OR® 15.2 User's Guide: Network Optimization Algorithms" pp. 1-141, Aug. 18, 2020.
SAS Institute Inc., "SAS/STAT® 9.22 User's Guide", Chapters 11 and 34, pp. 1-102, 2010.

\* cited by examiner

Customers Interrupted (Preventable) 69 ~ 804

Customer Minutes Of Interruption (Preventable) 4,485 ~ 806

SAS Viya

Asset List 808

| Group ID | Substation | Circuit | CI | ▶ | CMI |
|---|---|---|---|---|---|
| 268 | Ulah #2 | 23 | | 33 | 2,145 |
| 843 | Asheboro-East | 10 | | 12 | 780 |
| 1308 | Asheboro-East | 11 | | 8 | 520 |
| 843 | Asheboro-East | 11 | | 7 | 455 |
| 1095 | Ulah #2 | 23 | | 6 | 390 |
| 1308 | Asheboro-East | 10 | | 3 | 195 |

Current Emission Sources

Customers Interrupted (Preventable)     Customer Minutes Of Interruption (Preventable)
69 ~804  816       4,485 ~806

SAS Viya

Current Emission Sources    Asset List

| Circuit | Asset ID | Asset Type | CI | CMI | Asset Description |
|---|---|---|---|---|---|
| 23 | FS1378002 | Fuse | 33 | 2,145 | Fuse-15 T |
| 10 | FS1444019 | Fuse | 12 | 780 | Fuse-50 T |
| 23 | 1378010 | Transformer | 10 | 650 | 1378010 |
| 11 | FS1444015 | Fuse | 8 | 520 | Fuse-25 T |
| 11 | 1444178 | Transformer | 7 | 455 | 1444178 |
| 11 | 1444117 | Transformer | 7 | 455 | 1444117 |
| 10 | 1444148 | Transformer | 6 | 390 | 1444148 |
| 23 | 1377003 | Transformer | 6 | 390 | 1377003 |
| 23 | 1377002 | Transformer | 5 | 325 | 1377002 |
| 23 | 1377002 | Transformer | 5 | 325 | 1377002 |
| 10 | 1444149 | Transformer | 4 | 260 | 1444149 |
| 10 | 1444131 | Transformer | 4 | 260 | 1444131 |
| 23 | 1378015 | Transformer | 3 | 195 | 1378015 |
| 10 | 1444006 | Transformer | 3 | 195 | 1444006 |
| 23 | 1378017 | Transformer | 3 | 195 | 1378017 |
| 11 | FS1444028 | Fuse | 2 | 130 | Fuse-50 T |

GRID STATUS MONITORING SYSTEM

CROSS-REFERENCE TO RELATED APPLICATIONS

The present application claims the benefit of and priority under 35 U.S.C. § 119(e) to U.S. Provisional Patent Application No. 63/393,332 filed Jul. 29, 2022, and to U.S. Provisional Patent Application No. 63/430,328 filed Dec. 5, 2022, the entire contents of which are hereby incorporated by reference.

BACKGROUND

When electric equipment in the transmission and distribution system of electrical power deteriorates, a pre-failure signature in the form of a radio-frequency (RF) signal may be broadcast into the airwaves due to arcing. For example, when a ceramic insulator is cracked, the effectiveness of its insulating function is reduced. Arcing takes place between a high voltage conductor and a mounting pin, which results in the generation of the RF signal. Utility companies typically rely on visual inspection, infrared sensing, ultrasonic testing, etc. to identify degraded equipment. However, these technologies cannot detect RF emissions from degraded equipment despite the fact that research shows RF emissions are leading indicators of equipment degradation that may lead to failure. RF emissions can be used to detect equipment deterioration well-before, sound, IR, or visual inspection can detect the same deterioration resulting in additional time to determine an appropriate response and to avoid power outages that may result due to the degradation.

SUMMARY

In an example embodiment, a computer-readable medium is provided having stored thereon computer-readable instructions that when executed by a computing device, cause the computing device to monitor a status of grid devices using sensor measurements. Sensor data is clustered using a predefined grouping distance value to define one or more sensor event clusters. The sensor data includes a plurality of sensor measurements where each sensor measurement of the plurality of sensor measurements includes a signal intensity measurement value, a location of a sensor when the signal intensity measurement value was determined by the sensor, and a time that the signal intensity measurement value was determined by the sensor. The signal intensity measurement value is measured for a signal emitted by a monitored device. Each sensor measurement is assigned to a single sensor event cluster with each sensor event cluster having a size defined by the predefined grouping distance value. A plurality of monitored devices is clustered using a predefined clustering distance value to define one or more asset clusters. The monitored device is one of the plurality of monitored devices. Each monitored device is assigned to a single asset cluster with each asset cluster having a size defined by the predefined clustering distance value. A location is associated with each monitored device of the plurality of monitored devices. A distance is computed between each sensor event cluster and each asset cluster. When the computed distance is less than or equal to a predefined asset/sensor distance value for a sensor event cluster and an asset cluster, an asset identifier of the asset cluster associated with the computed distance is added to an asset event list. For each asset cluster included in the asset event list, an asset location of an asset is shown on a map in a graphical user interface presented in a display. The asset location is associated with the asset identifier of a respective asset cluster included in the asset event list.

In another example embodiment, a computing device is provided. The computing device includes, but is not limited to, a processor and a computer-readable medium operably coupled to the processor. The computer-readable medium has instructions stored thereon that, when executed by the processor, cause the computing device to monitor a status of grid devices using sensor measurements.

In yet another example embodiment, a method of monitoring a status of grid devices using sensor measurements is provided.

Other principal features of the disclosed subject matter will become apparent to those skilled in the art upon review of the following drawings, the detailed description, and the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Illustrative embodiments of the disclosed subject matter will hereafter be described referring to the accompanying drawings, wherein like numerals denote like elements.

DETAILED DESCRIPTION

Figure 1:
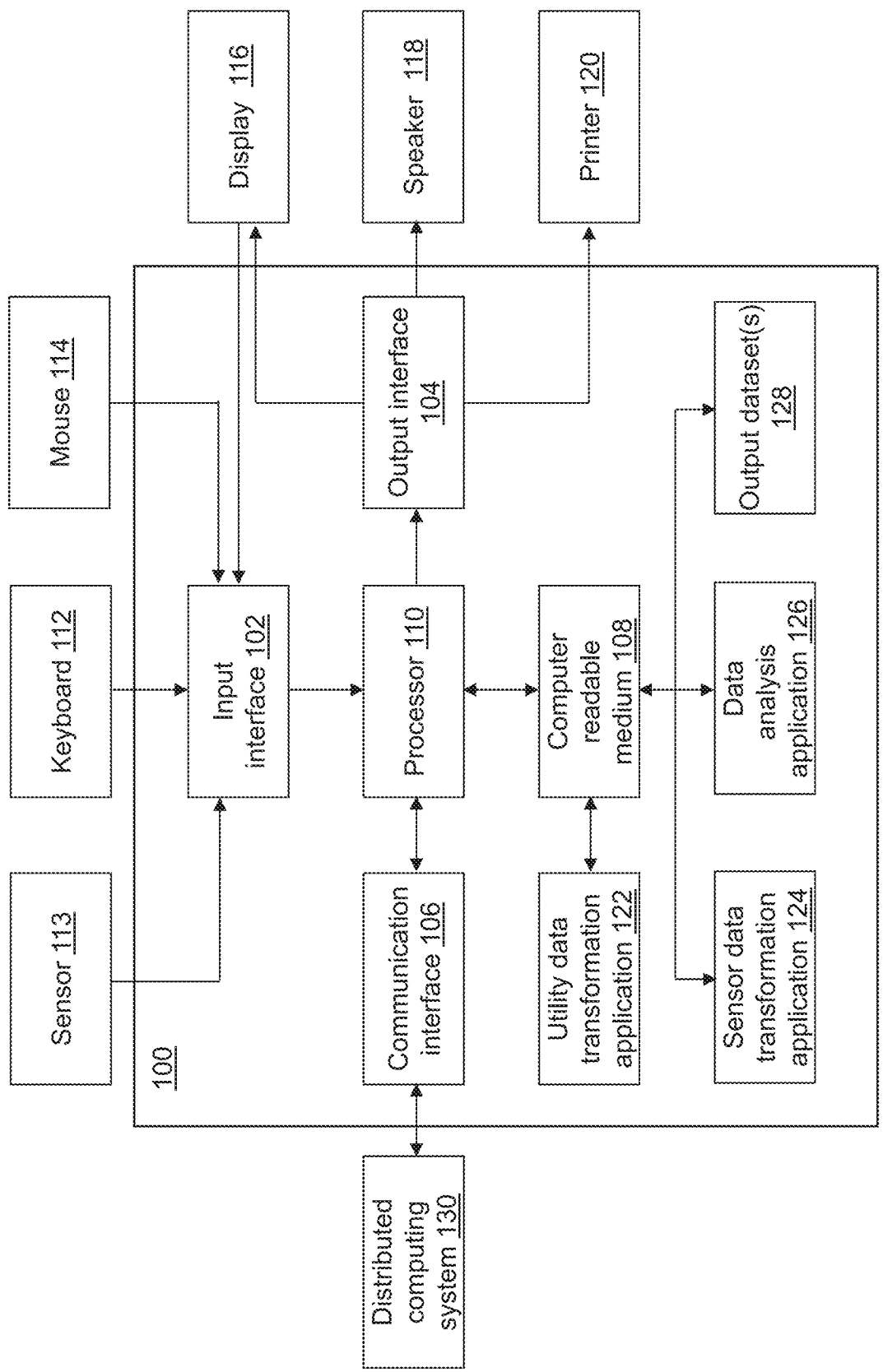
FIG. 1 depicts a block diagram of a data analysis device in accordance with an illustrative embodiment.

A data analysis application 126 (shown referring to FIG. 1) performs analysis of grid data and sensor data to identify grid devices that are probable emission sources of sensor measurements that may indicate a degraded or degrading grid device. The grid refers to the electricity transmission network that provides electricity from various power generation systems to electricity demand locations through substations and overhead and buried cables as understood by a person of skill in the art. The above ground cable networks include poles of various materials and sizes to which grid devices are mounted and connected to each other through conductive wires or overhead lines. As used herein, an asset may refer to a discrete grid device.

An example device to generate the sensor data is the Trekker™ sensor manufactured by Exacter, Inc. of Columbus, Ohio USA. For example, U.S. Pat. Nos. 7,912,660, 7,577,535, and 10,209,291 describe characteristics of the Trekker sensor.

In an illustrative embodiment, a sensor 113 (shown referring to FIG. 1) is mounted on a vehicle, such as a garbage truck, a postal truck, a delivery truck, etc., that travels a regular route adjacent to portions of the electrical grid. For example, electrical grid devices, such as a transformer, a fuse, a pole, a recloser, a switch, an insulator, a capacitor, etc. are typically located near a road such that a vehicle mounted sensor 113 can detect measurements from the electrical grid devices.

The route may be daily, weekly, monthly, etc. In an illustrative embodiment, the sensor periodically detects RF emissions. For example, each second, sensor 113 may obtain a measurement of the local electromagnetic radiation field in the RF frequency band to determine whether an RF emission is detected from a grid device as opposed to a different type of device, such as an RF transmitter. For illustration, the RF frequency band is from 3 Hertz (Hz) to 3,000 Gigahertz In alternative embodiments, sensor 113 may be designed to measure other physical phenomena such as ultrasound, a microphone, or a different electromagnetic radiation frequency band including IR in addition to the RF emissions or in the alternative.

A measure of a strength or intensity of the detected signal may be computed. For example, the Trekker sensor computes a maintenance merit value (MMV) as a measure of the signal intensity and sets an emission source flag value that indicates whether the emission likely came from a grid device as opposed to a different type of device.

Sensor 113 may refer to a device that includes a plurality of sensors. For example, sensor 113 may also include a global positioning system (GPS) sensor that determines a location, such as the geodetic coordinates at which each sensor measurement is taken. Sensor 113 further may include additional types of sensors such as environmental sensors that measure a barometric pressure, a temperature, a relative humidity, air contaminants, etc.

A plurality of sensors 113 may be used to monitor a predefined portion of the grid. For illustration, the predefined portion of the grid may be associated with a municipality or an electricity provider. For example, a different sensor 113 may be mounted on each of a plurality of vehicles that drive a predefined route each day, week, month, etc.

Figure 10:
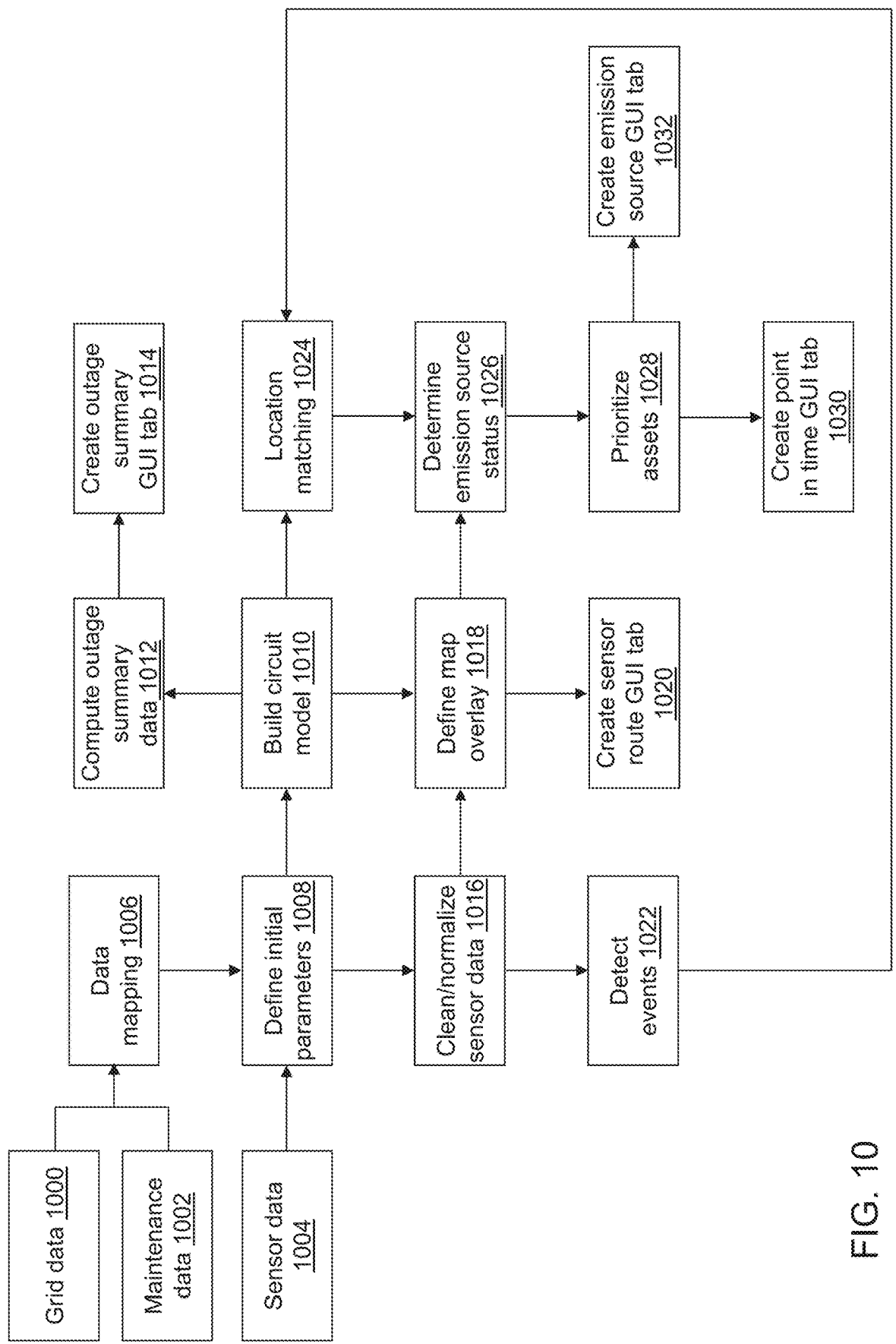
FIG. 10 depicts a block diagram of a system solution in accordance with an illustrative embodiment.

Referring to FIG. 10, a block diagram of a system solution to identify potential issues on the distribution grid is shown in accordance with an illustrative embodiment. The system solution may include grid data 1000, maintenance data 1002, sensor data 1004, a data mapping process 1006, a define initial parameters process 1008, a build circuit model process 1010, a compute outage summary data process 1012, a create outage summary GUI tab 1014, a clean and/or normalize data process 1016, a define map overlay process 1018, a create sensor route GUI tab 1020, a detect events process 1022, a location matching process 1024, a define emission source status process 1026, a prioritize assets process 1028, a create point in time GUI tab 1030, and a create emission source GUI tab 1032. Grid data 1000, maintenance data 1002, and sensor data 1004 may be acquired from different sources and may use different formats. Sensor readings may be collected and uploaded on a predefined timeframe such as daily. Utilities may provide geographic information system (GIS) data for their circuit in grid data 1000 that may include one or more discrete asset locations. The utilities may provide outage information related to their circuit in maintenance data 1002.

Data mapping process 1006 reads and processes grid data 1000 and maintenance data 1002 into a format for further processing. Define initial parameters process 1008 may access utility specific data parameters such as a projection method to convert between earth-centered, earth-fixed (ECEF) coordinates and geodetic coordinates, a definition of a date format, exclusion filters, predefined distances for clustering, etc. Geodetic coordinates are defined using a latitude, a longitude, and an altitude.

Build circuit model process 1010 reads asset type data from grid data 1000 and combines the data to create circuit model data. Assets may be grouped using a clustering process for disjoint cluster analysis to identify geographical regions of interest. The asset locations may be converted from geodetic coordinates to ECEF coordinates and a predefined cluster radius, such as 50 feet, applied to group the assets so that a single cluster may be used to represent a plurality of individual assets.

Compute outage summary data process 1012 may join the circuit model data with equipment related outages from maintenance data 1002 to compute a median time to repair used to estimate customer minutes of interruption (CMI) if an equipment failure occurs. Major event days (MED) may be excluded from the outage summary data. Create outage summary GUI tab 1014 may create a GUI window that visually presents the computed outage summary data. For example, as discussed further below, a third user interface window 500 (shown referring to FIGS. 5, 6, 7, 8A, 8A (continued), 8B, and 8B (continued)) in accordance with an illustrative embodiment) may present an outage history tab 502 shown referring to FIG. 5. A cluster centroid may be computed to plot the assets on a map as a group to reduce the amount of data. A unique source identifier may be assigned to each cluster.

Clean and/or normalize data process 1016 may clean and/or normalize grid data 1000, maintenance data 1002, and/or sensor data 1004 for further processing. Define map overlay process 1018 combines sensor location data from sensor data 1004 that is overlaid on the circuit model. Create sensor route GUI tab 1020 may create a GUI window that visually presents the sensor route data. For example, as discussed further below, third user interface window 500 may present a vehicle route tab 504 shown referring to FIG. 6.

Detect events process 1022 may group and/or filter signals from sensor data 1004. For example, signals obtained during a specific time period may be grouped when successive measurements are within a predefined distance of each other and associated with a single event. A signal intensity may be associated with the grouped signals based on a highest signal intensity among the included successive measurements. Various rules may be applied to identify an event.

Location matching process 1024 may match events with assets in the circuit model. Groups that meet the minimum persistence criterion and are within a fourth predefined distance based on a detection range of the sensor of an asset in the circuit model may be filtered to define an asset event list. For example, a detection range may be defined for the sensor based on a minimum detectable signal-to-noise ratio defined for the sensor that is an antenna as understood by a person of skill in the art. For example, event groups may be defined as part of the location matching process to geolocate signals in aggregate similar to triangulating signals to a geographic location.

Define emission source status process 1026 may identify emission sources. The assets identified across time intervals in the asset event list may be compared and flagged as active, inactive, or new. The flag may be associated with the source identifier to maintain a history of activity. In an illustrative embodiment, a current active list, a current inactive list, a current new list, an historical active list, an historical inactive list, and an historical new list are maintained to include a list of devices with the associated status. The current active list, the current inactive list, and the current new list may be maintained for assets with the associated status over a predefined current time period such as four weeks. The current active list, the current inactive list, and the current new list may be maintained in a current table. The historical active list, the historical inactive list, and the historical new list may be maintained for assets with the associated status over the entire time period during which the assets have been monitored. The historical active list, the historical inactive list, and the historical new list may be maintained in an historical table. In some cases, an asset may change from active to inactive to new in various permutations. This history is maintained in the historical table. The source identifier that indicates the cluster to which each asset belongs may also be maintained in the current table and the historical table.

For a first-time interval, the source identifiers identified as an emission source may be flagged as new. For the remaining intervals, the source identifiers may be compared with the asset event list for one or more previous intervals and flagged as active or inactive. For example, when a source identifier is found in both a new asset event list and a previous asset event list, the source identifier may be flagged as active; when the source identifier is not found in both the new asset event list and the previous asset event list, whether the sensor passed the region associated with the asset(s) identified by the source identifier may be determined. When the sensor passed the region associated with the asset(s), the source identifier may be flagged as inactive; otherwise, the source identifier may be flagged as active. In this manner, when the sensor does not pass a region associated with the asset(s), the asset is not classified as inactive until the sensor passes the region associated with the asset(s) and no longer determines that the asset(s) constitute an emission source.

Assets may not be dropped from the active list when the sensor did not pass the region associated with the asset because the asset may still be emitting though a signal was not captured. A time to monitor coverage may be managed by a minimum interval value and a maximum interval value. For example, the minimum interval value may be defined as four weeks and the maximum interval value may be defined as six weeks to see if an asset is still emitting and meets the pass criterion to be considered persistent and flagged as an active or new emission source. The interval may be selected to be sufficient to allow resumption of a regular route that may have been disrupted. The minimum interval value may be used to determine when an asset is moved from the active list to the inactive list. The maximum interval value may be used to determine when an asset is removed from the inactive list.

Coverage analysis on weekly data may be used to determine when there were enough passes. The number of passes may be determined by checking unique dates within the interval irrespective of the number of vehicles that made the pass or whether a qualified signal was detected. For illustration, when the number of passes is greater than or equal to three, the source identifier may be flagged as inactive; when the number of passes is less than three, the source identifier may be flagged as active.

Prioritize assets process 1028 may prioritize assets based on an estimated impact and whether it is a critical device within a protective zone. A protective zone is an area serviced by a protective device such as a recloser, a fuse, etc. For example, the estimated impact may be determined based on a number of customers that would be affected if the probable emission source experienced a failure leading to an outage by the asset and/or the CMI computed by multiplying the number of customers that would be affected by a median time to repair the asset.

Create point in time GUI tab 1030 may create a GUI window that visually presents the point in time data. For example, as discussed further below, third user interface window 500 may present a point in time tab 506 shown referring to FIG. 7. The asset event list for all time intervals may be used to update the point in time data included in point in time tab 506.

Create emission source GUI tab 1032 may create a GUI window that visually presents the emission source data. For example, as discussed further below, third user interface window 500 may present a probable emission source tab 508 shown referring to FIGS. 8A, 8A (continued), 8B, and 8B (continued). The asset event list for a most recent time interval may be used to update the current emission sources included in probable emission source tab 508.

Referring to FIG. 1, a block diagram of a data analysis device 100 is shown in accordance with an illustrative embodiment. Data analysis device 100 may include an input interface 102, an output interface 104, a communication interface 106, a non-transitory computer-readable medium 108, a processor 110, utility data transformation application 122, sensor data transformation application 124, data analysis application 126, and one or more output datasets 128. Fewer, different, and/or additional components may be incorporated into data analysis device 100.

Input interface 102 provides an interface for receiving information from the user or another device for entry into data analysis device 100 as understood by those skilled in the art. Input interface 102 may interface with various input technologies including, but not limited to, a keyboard 112, sensor 113, a mouse 114, a display 116, a track ball, a keypad, one or more buttons, etc. to allow the user to enter information into data analysis device 100 or to make selections presented in a user interface displayed on display 116 or to allow a device to provide data to data analysis device 100.

The same interface may support both input interface 102 and output interface 104. For example, display 116 comprising a touch screen provides a mechanism for user input and for presentation of output to the user. Data analysis device 100 may have one or more input interfaces that use the same or a different input interface technology. The input interface technology further may be accessible by data analysis device 100 through communication interface 106.

Output interface 104 provides an interface for outputting information for review by a user of data analysis device 100 and/or for use by another application or device. For example, output interface 104 may interface with various output technologies including, but not limited to, display 116, a speaker 118, a printer 120, etc. Data analysis device 100 may have one or more output interfaces that use the same or a different output interface technology. The output interface technology further may be accessible by data analysis device 100 through communication interface 106.

Communication interface 106 provides an interface for receiving and transmitting data between devices using various protocols, transmission technologies, and media as understood by those skilled in the art. Communication interface 106 may support communication using various transmission media that may be wired and/or wireless. Data analysis device 100 may have one or more communication interfaces that use the same or a different communication interface technology. For example, data analysis device 100 may support communication using an Ethernet port, a Bluetooth® antenna, a Wi-Fi antenna, a telephone jack, a USB port, etc. Data and/or messages may be transferred between data analysis device 100 and another computing device of a distributed computing system 130 using communication interface 106.

Computer-readable medium 108 is an electronic holding place or storage for information so the information can be accessed by processor 110 as understood by those skilled in the art. Computer-readable medium 108 can include, but is not limited to, any type of random access memory (RAM), any type of read only memory (ROM), any type of flash memory, etc. such as magnetic storage devices (e.g., hard disk, floppy disk, magnetic strips, . . . ), optical disks (e.g., compact disc (CD), digital versatile disc (DVD), . . . ), smart cards, flash memory devices, etc. Data analysis device 100 may have one or more computer-readable media that use the same or a different memory media technology. For example, computer-readable medium 108 may include different types of computer-readable media that may be organized hierarchically to provide efficient access to the data stored therein as understood by a person of skill in the art. As an example, a cache may be implemented in a smaller, faster memory that stores copies of data from the most frequently/recently accessed main memory locations to reduce an access latency. Data analysis device 100 also may have one or more drives that support the loading of a memory media such as a CD, DVD, an external hard drive, etc. One or more external hard drives further may be connected to data analysis device 100 using communication interface 106.

Processor 110 executes instructions as understood by those skilled in the art. The instructions may be carried out by a special purpose computer, logic circuits, or hardware circuits. Processor 110 may be implemented in hardware and/or firmware. Processor 110 executes an instruction, meaning it performs/controls the operations called for by that instruction. The term "execution" is the process of running an application or the carrying out of the operation called for by an instruction. The instructions may be written using one or more programming languages, scripting languages, assembly languages, etc. Processor 110 operably couples with input interface 102, with output interface 104, with communication interface 106, and with computer-readable medium 108 to receive, to send, and to process information. Processor 110 may retrieve a set of instructions from a permanent memory device and copy the instructions in an executable form to a temporary memory device that is generally some form of RAM. Data analysis device 100 may include a plurality of processors that use the same or a different processing technology.

Some machine-learning approaches may be more efficiently and speedily executed and processed with machine-learning specific processors (e.g., not a generic central processing unit (CPU)). Such processors may also provide additional energy savings when compared to generic CPUs. For example, some of these processors can include a graphical processing unit (GPU), an application-specific integrated circuit, a field-programmable gate array, an artificial intelligence accelerator, a purpose-built chip architecture for machine learning, and/or some other machine-learning specific processor that implements a machine learning approach using semiconductor (e.g., silicon, gallium arsenide) devices. These processors may also be employed in heterogeneous computing architectures with a number of and a variety of different types of cores, engines, nodes, and/or layers to achieve energy efficiencies, processing speed improvements, data communication speed improvements, and/or data efficiency targets and improvements throughout various parts of the system.

Utility data transformation application 122 performs operations associated with transforming data that describes various grid devices, grid customers, grid device outages, grid maintenance data, etc. Some or all of the operations described herein may be embodied in utility data transformation application 122. The operations may be implemented using hardware, firmware, software, or any combination of these methods. For example, utility data transformation application 122 may perform data mapping process 1006, define initial parameters process 1008, build circuit model process 1010, compute outage summary data process 1012, and/or create outage summary GUI tab 1014.

Referring to the example embodiment of FIG. 1, utility data transformation application 122 is implemented in software (comprised of computer-readable and/or computer-executable instructions) stored in computer-readable medium 108 and accessible by processor 110 for execution of the instructions that embody the operations of utility data transformation application 122. Utility data transformation application 122 may be written using one or more programming languages, assembly languages, scripting languages, etc. Utility data transformation application 122 may be integrated with other analytic tools. As an example, utility data transformation application 122 may be part of an integrated data analytics software application and/or software architecture such as that offered by SAS Institute Inc. of Cary, North Carolina, USA. Merely for illustration, utility data transformation application 122 may be implemented using or integrated with one or more SAS software tools such as JMP®, Base SAS, SAS® Enterprise Miner™, SAS® Event Stream Processing, SAS/STAT®, SAS® High Performance Analytics Server, SAS® Visual Data Mining and Machine Learning, SAS® LASR™, SAS® In-Database Products, SAS® Scalable Performance Data Engine, SAS® Cloud Analytic Services (CAS), SAS/ORO, SAS/ETS®, SAS® Visual Analytics, SAS® Viya™, SAS In-Memory Statistics for Hadoop®, etc. all of which are developed and provided by SAS Institute Inc. of Cary, North Carolina, USA. Data mining, statistical analytics, and response prediction are practically applied in a wide variety of industries to solve technical problems.

Utility data transformation application 122 may be implemented as a Web application. For example, utility data transformation application 122 may be configured to receive hypertext transport protocol (HTTP) responses and to send HTTP requests. The HTTP responses may include web pages such as hypertext markup language (HTML) documents and linked objects generated in response to the HTTP requests. Each web page may be identified by a uniform resource locator (URL) that includes the location or address of the computing device that contains the resource to be accessed in addition to the location of the resource on that computing device. The type of file or resource depends on the Internet application protocol such as the file transfer protocol, HTTP, H.323, etc. The file accessed may be a simple text file, an image file, an audio file, a video file, an executable, a common gateway interface application, a Java® applet, an extensible markup language (XML) file, or any other type of file supported by HTTP.

Sensor data transformation application 124 performs operations associated with transforming data generated by one or more of sensors 113. Some or all of the operations described herein may be embodied in sensor data transformation application 124. Similar to utility data transformation application 122, sensor data transformation application 124 may be implemented as a Web application. For example, sensor data transformation application 124 may perform clean and/or normalize data process 1016, define map overlay process 1018, create sensor route GUI tab 1020, and/or detect events process 1022.

Referring to the example embodiment of FIG. 1, sensor data transformation application 124 is implemented in software (comprised of computer-readable and/or computer-executable instructions) stored in computer-readable medium 108 and accessible by processor 110 for execution of the instructions that embody the operations of sensor data transformation application 124. Sensor data transformation application 124 may be written using one or more programming languages, assembly languages, scripting languages, etc. Similar to utility data transformation application 122, sensor data transformation application 124 may be integrated with other analytic tools such as the integrated data analytics software application and/or software architecture offered by SAS Institute Inc. of Cary, North Carolina, USA.

For example, sensor 113 may include one or more sensors of various types that produce a sensor signal value referred to as a measurement data value representative of a measure of a physical quantity in an environment to which the sensor is associated and that generate a corresponding measurement datum that typically is associated with a time that the measurement datum is generated. The environment to which the sensor is associated for monitoring may include the electrical power grid system referred to herein as the grid. Example sensor types include a pressure sensor, a temperature sensor, a position or location sensor, a velocity sensor, an acceleration sensor, a fluid flow rate sensor, a voltage sensor, a current sensor, a frequency sensor, a phase angle sensor, a data rate sensor, a humidity sensor, an acoustic sensor, a light sensor, a motion sensor, an electromagnetic field sensor, a force sensor, a torque sensor, a load sensor, a strain sensor, a chemical property sensor, a resistance sensor, a radiation sensor, an irradiance sensor, a proximity sensor, a distance sensor, a vibration sensor, etc. that may be mounted to various devices, such as a vehicle. The devices themselves may include one or more sensors and/or may be connected to one or more other devices to receive a measurement datum or to send a measurement datum to another device. For example, the Trekker sensor may connect to a cellular network to upload data to another computing device for storage of the generated sensor data remote from the device.

Data analysis application 126 performs operations associated with analyzing the transformed utility and sensor data. Some or all of the operations described herein may be embodied in data analysis application 126. Similar to utility data transformation application 122, data analysis application 126 may be implemented as a Web application. For example, data analysis application 126 may perform location matching process 1024, define emission source status process 1026, prioritize assets process 1028, create point in time GUI tab 1030, and/or create emission source GUI tab 1032.

Referring to the example embodiment of FIG. 1, data analysis application 126 is implemented in software (comprised of computer-readable and/or computer-executable instructions) stored in computer-readable medium 108 and accessible by processor 110 for execution of the instructions that embody the operations of sensor data transformation application 124. Data analysis application 126 may be written using one or more programming languages, assembly languages, scripting languages, etc. Similar to utility data transformation application 122, data analysis application 126 may be integrated with other analytic tools such as the integrated data analytics software application and/or software architecture offered by SAS Institute Inc. of Cary, North Carolina, USA. Utility data transformation application 122, sensor data transformation application 124, and data analysis application 126 may be integrated in various manners to form one or more applications executable by a user.

The sensor and utility data that are transformed may be stored in one or more locations on data analysis device 100 and/or on one or more devices of distributed computing system 130. The sensor and utility data may be stored using various data structures as known to those skilled in the art including one or more files of a file system, a relational database, one or more tables of a system of tables, a structured query language database, one or more SAS® datasets, etc. on data analysis device 100 or on distributed computing system 130. For example, the sensor and utility data may be stored in various files, databases, datasets, etc. referred to herein as datasets for simplicity.

Each dataset of the sensor and utility data may include, for example, a plurality of rows and a plurality of columns. The plurality of rows may be referred to as observation vectors or records (observations), and the columns may be referred to as variables. In an alternative embodiment, the sensor and utility data may be transposed.

In data science, engineering, and statistical applications, data often consists of measurements (across sensors, characteristics, responses, etc.) collected across multiple time instances. These measurements may be collected in the sensor and utility data for analysis and processing or streamed to data analysis device 100 as it is generated. The sensor and utility data may include data captured as a function of time for one or more sensors 113. The data stored in the sensor and utility data may be captured at different time points, periodically, intermittently, when an event occurs, etc. The sensor and utility data may include data captured at a high data rate such as 200 or more observation vectors per second for one or more sensors 113. One or more columns of the sensor and utility data may include a time and/or date value referred to herein as a timestamp. The sensor and utility data may include data captured under normal and abnormal operating conditions of the physical object.

The data stored in the sensor and utility data may be received directly or indirectly from sensor 113 and may or may not be pre-processed in some manner. For example, the data may be pre-processed using an event stream processor such as the SAS® Event Stream Processing Engine (ESPE), developed and provided by SAS Institute Inc. of Cary, North Carolina, USA. For example, data stored in the sensor and utility data may be generated as part of the Internet of Things (IoT), where things (e.g., machines, devices, phones, sensors) can be connected to networks and the data from these things collected and processed within the things and/or external to the things before being stored in the sensor and utility data. For example, the IoT can include sensors in many different devices and types of devices, and high value analytics can be applied to identify hidden relationships and drive increased efficiencies. This can apply to both big data analytics and real-time analytics. Some of these devices may be referred to as edge devices, and may involve edge computing circuitry. Again, some data may be processed with an ESPE, which may reside in the cloud or in an edge device before being stored in the sensor and utility data.

The data stored in the sensor and utility data may include any type of content represented in any computer-readable format such as binary, alphanumeric, numeric, string, markup language, etc. The content may include textual information, graphical information, image information, audio information, numeric information, etc. that further may be encoded using various encoding techniques as understood by a person of skill in the art.

The sensor and utility data may be stored on computer-readable medium 108 and/or on one or more computer-readable media of distributed computing system 130 and accessed by data analysis device 100 using communication interface 106, input interface 102, and/or output interface 104. The sensor and utility data may be stored in various compressed formats such as a coordinate format, a compressed sparse column format, a compressed sparse row format, etc. The data may be organized using delimited fields, such as comma or space separated fields, fixed width fields, using a SAS® dataset, etc. The SAS dataset may be a SAS® file stored in a SAS® library that a SAS® software tool creates and processes. The SAS dataset contains data values that are organized as a table of observation vectors (rows) and variables (columns) that can be processed by one or more SAS software tools.

Data analysis device 100 may coordinate access to the sensor and utility data that is distributed across distributed computing system 130 that may include one or more computing devices. For example, the sensor and utility data may be stored in one or more cubes distributed across a grid of computers as understood by a person of skill in the art. As another example, the sensor and utility data may be stored in a multi-node Hadoop® cluster. For instance, Apache™ Hadoop® is an open-source software framework for distributed computing supported by the Apache Software Foundation. As another example, the sensor and utility data may be stored in a cloud of computers and accessed using cloud computing technologies, as understood by a person of skill in the art. The SAS® LASR™ Analytic Server may be used as an analytic platform to enable multiple users to concurrently access data stored in the sensor and utility data. The SAS Viya open, cloud-ready, in-memory architecture also may be used as an analytic platform to enable multiple users to concurrently access data stored in the sensor and utility data. SAS CAS may be used as an analytic server with associated cloud services in SAS Viya. Some systems may use SAS In-Memory Statistics for Hadoop® to read big data once and analyze it several times by persisting it in-memory for the entire session. Some systems may be of other types and configurations.

Figure 2:
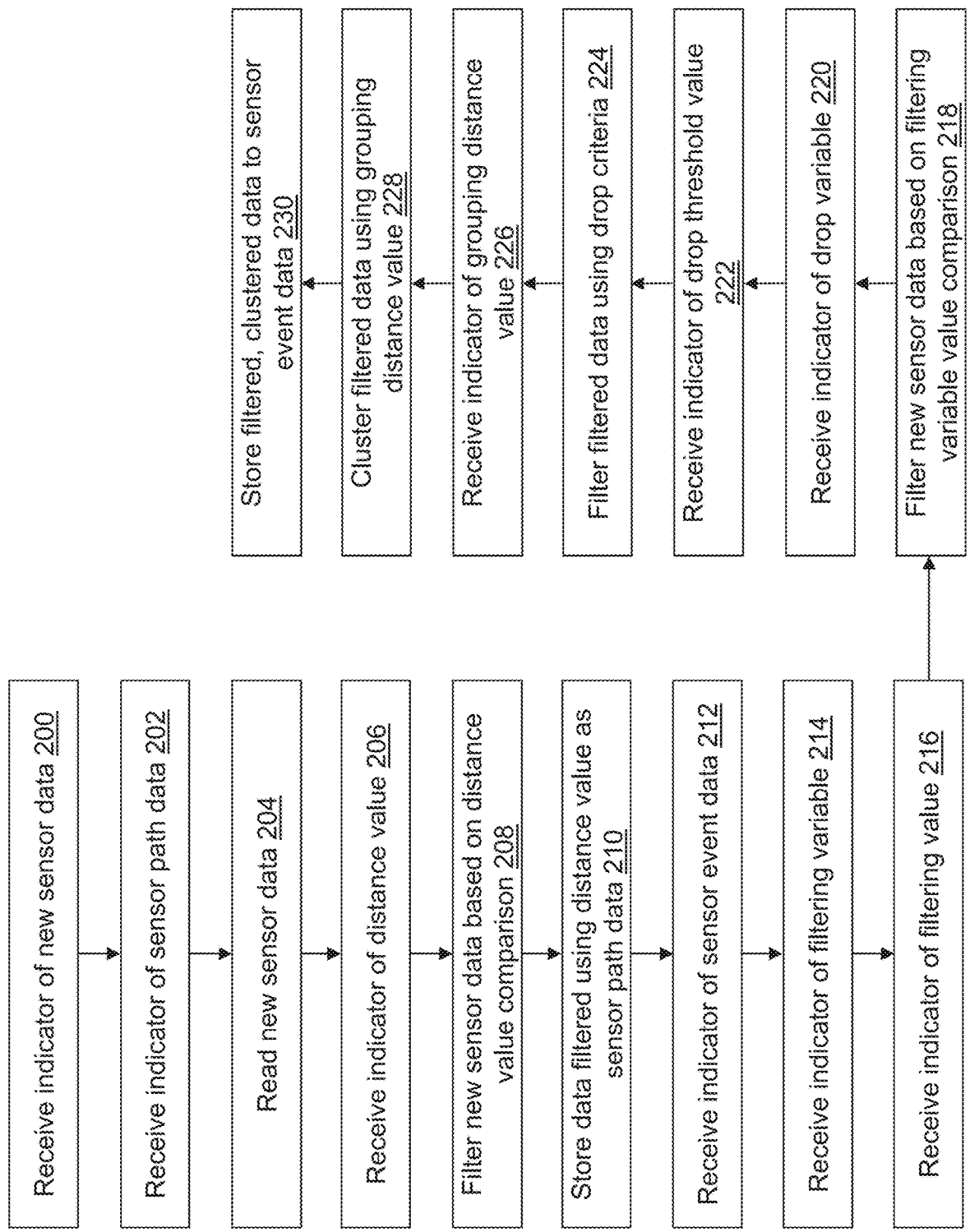
FIG. 2 depicts a flow diagram illustrating examples of operations performed by a sensor data transformation application of the data analysis device of FIG. 1 in accordance with an illustrative embodiment.

Referring to FIG. 2, example operations associated with sensor data transformation application 124 are described. Additional, fewer, or different operations may be performed depending on the embodiment of sensor data transformation application 124. The order of presentation of the operations of FIG. 2 is not intended to be limiting. Some of the operations may not be performed in some embodiments. Although some of the operational flows are presented in sequence, the various operations may be performed in various repetitions and/or in other orders than those that are illustrated. For example, a user may execute sensor data transformation application 124, which causes presentation of a first user interface window, which may include a plurality of menus and selectors such as drop-down menus, buttons, text boxes, hyperlinks, etc. associated with sensor data transformation application 124 as understood by a person of skill in the art. The plurality of menus and selectors may be accessed in various orders. An indicator may indicate one or more user selections from a user interface, one or more data entries into a data field of the user interface such as a text box or a control window, one or more data items read from computer-readable medium 108, or otherwise defined with one or more default values, etc. that are received as an input by sensor data transformation application 124. The operations of sensor data transformation application 124 further may be performed in parallel using a plurality of threads and/or a plurality of worker computing devices.

In an operation 200, a first indicator may be received that indicates new sensor data generated by sensor 113 and stored in sensor data 1004. Sensor 113 may refer to one or more sensors of the same or different type. For example, the first indicator indicates a location and a name of the new sensor data. As an example, the first indicator may be received by sensor data transformation application 124 after selection from a user interface window or after entry by a user into a user interface window. In an alternative embodiment, the new sensor data may not be selectable. For example, a most recently created dataset may be used automatically. The new sensor data may be captured each second in an illustrative embodiment.

The new sensor data may have been captured over a predefined period of time to obtain sensor measurements from each sensor 113 over a predefined set of locations. For example, the predefined set of locations may include a road route covered by a vehicle on which each sensor 113 is mounted such as a road route taken by a garbage truck weekly. The new sensor data may include data from each sensor 113 mounted to a fleet of vehicles such as a plurality of garbage trucks that traverse a predefined area such as a rural route or an urban route through a municipality.

Figure 9:
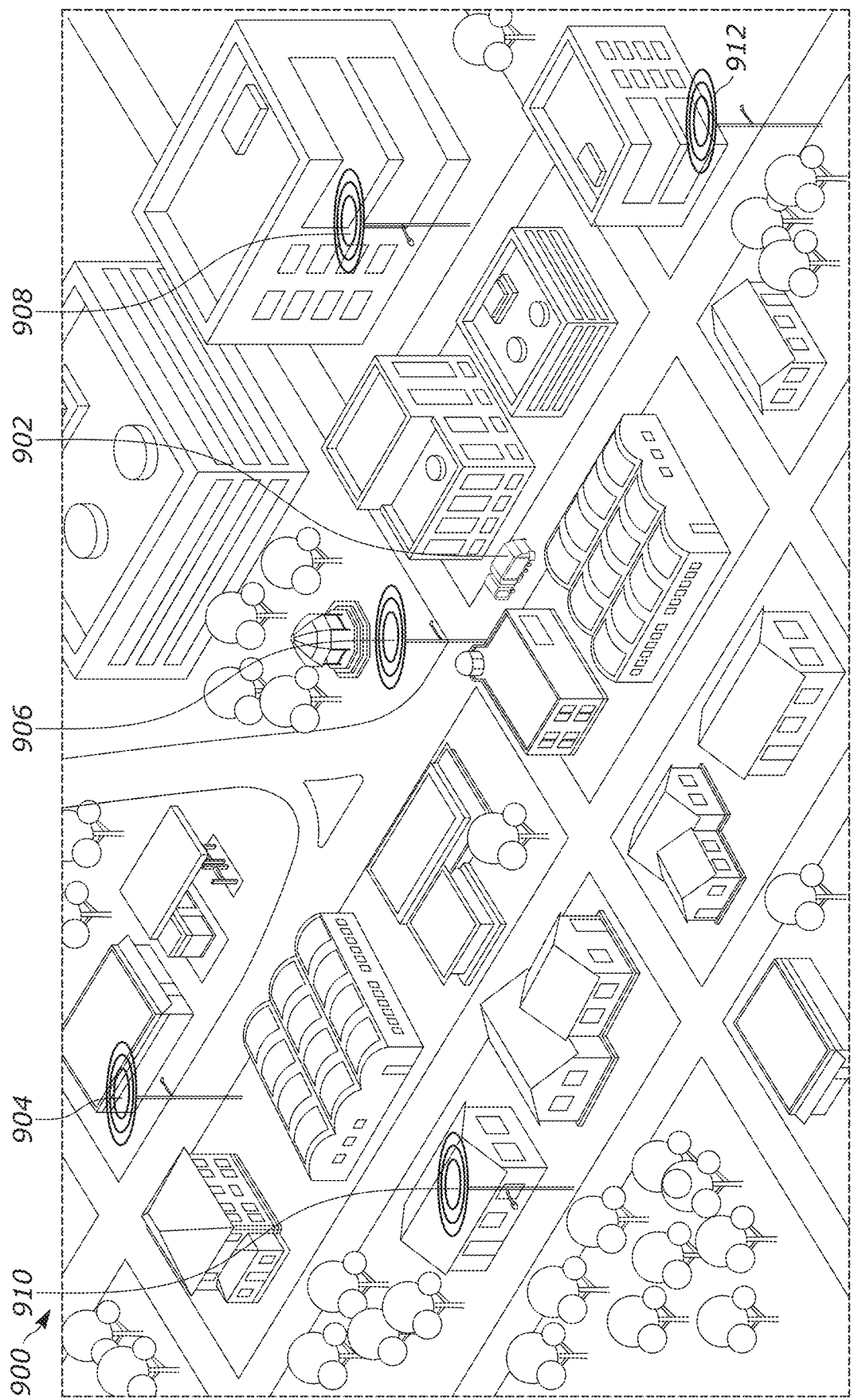
FIG. 9 shows an area map that includes a vehicle and multiple transmission poles in accordance with an illustrative embodiment.

For example, referring to FIG. 9, a vehicle 902 is shown located on an area map 900 that shows streets, building locations, and electrical grid assets in accordance with an illustrative embodiment. Illustrative electrical grid assets include a first transmission pole 904, a second transmission pole 906, a third transmission pole 908, a fourth transmission pole 910, and a fifth transmission pole 912. For example, the sensor may be mounted on vehicle 902 that travels a predefined path on the streets that is close to the various electrical grid assets at different times during the path traversal.

For example, at the point in time shown in FIG. 9, vehicle 902 is closest to second transmission pole 906 while traveling toward first transmission pole 904. An intensity of an RF emission source varies based on the distance from the source. As a result, as vehicle 902 travels closer and closer to first transmission pole 904, an intensity of an emission source located on first transmission pole 904 increases; while as vehicle 902 travels further and further away from second transmission pole 906, an intensity of an emission source located on second transmission pole 906 decreases. The new sensor data includes the location of vehicle 902 as well as an emission source signal intensity measurement, such as MMV, at each point in time that a measurement was obtained. Multiple signal intensity measurements may be received at the same time from different sources some of which may not be emission sources as explained previously.

In an illustrative embodiment, the new sensor data may include a serial number or other unique identifier for sensor 113 that may include a plurality of co-located sensors, a timestamp indicating a time at which each measurement was obtained, a latitude and a longitude at which each measurement was obtained, a signal intensity measurement value, a temperature measurement value, a humidity measurement value, an emission source flag value, sensor number indicator, etc. The timestamp may include a date and a time. Each sensor 113 may have a unique serial number. In an illustrative embodiment, the signal intensity measurement value may indicate energy within a predefined portion of the RF band that is separated from other energy present in the RF spectrum. The energy may be caused by high frequency transient currents that persist for a short period of time and repeat periodically due to a partial discharge from electrical grid equipment. In an illustrative embodiment, the emission source flag value indicates whether the emission is from equipment, such as an electrical grid device, that is being monitored as opposed to another type of source that is not being monitored by sensor 113.

In an operation 202, a second indicator may be received that indicates sensor path data defined by filtering data generated from sensor 113. For example, the second indicator indicates a location and a name of the sensor path data. As an example, the second indicator may be received by sensor data transformation application 124 after selection from a user interface window or after entry by a user into a user interface window. In an alternative embodiment, the sensor path data may not be selectable. For example, a predefined dataset may be used automatically.

The sensor path data may have been captured from each sensor 113 over the predefined set of locations and/or the predefined area. In an illustrative embodiment, the sensor path data may include a latitude, a longitude, a signal intensity measurement value, the sensor number indicator, etc.

In an operation 204, the new sensor data is read from the location defined using the first indicator.

In an operation 206, a third indicator of a distance value d may be received. In an alternative embodiment, the third indicator may not be received. For example, a default value may be stored, for example, in computer-readable medium 108 and used automatically. In another alternative embodiment, the value of the distance value d may not be selectable. Instead, a fixed, predefined value may be used. For illustration, a default value for the distance value d may be d=0.1 though other values may be used. In an illustrative embodiment, the distance value d is defined in miles. The distance value d is used to filter the new sensor data to include a single sensor measurement within the distance value d to plot a route of each vehicle on which sensor 113 is mounted with a reduced number of data points.

In an operation 208, the read, new sensor data is filtered using the distance value d to select sensor measurements that are the distance value d apart. For example, a first sensor measurement is selected for each unique vehicle and each unique time period included in the new sensor data. For illustration, the new sensor data may have been captured over a most recent one-week time period and include sensor measurements taken during multiple different routes taken by one or more vehicles while the unique time period is one day so that different routes taken each day possibly by each vehicle may be identified. A second sensor measurement is selected for each unique vehicle and each unique time period that is at least the distance value d from the first sensor measurement while the intermediate measurements are skipped. A third sensor measurement is selected for each unique vehicle and each unique time period that is at least the distance value d from the second sensor measurement while the intermediate measurements are skipped, and so on until a last sensor measurement is obtained for each unique vehicle and each unique time period. In alternative embodiments, the data may not be filtered separately based on each unique vehicle.

In an operation 210, the data selected during the filtering of operation 208 are stored as sensor path data. The data may be stored in computer-readable medium 108. The sensor path data may also include filtered sensor measurements from previous time periods. For example, the data selected during the filtering of operation 208 may be appended to data filtered from previous time periods. For illustration, data filtered from previous weeks/months/years may be stored in the sensor path data.

In an operation 212, a fourth indicator may be received that indicates sensor event data defined by filtering data generated from sensor 113. For example, the fourth indicator indicates a location and a name of the sensor event data. As an example, the fourth indicator may be received by sensor data transformation application 124 after selection from a user interface window or after entry by a user into a user interface window. In an alternative embodiment, the sensor event data may not be selectable. For example, a predefined dataset may be used automatically.

The sensor event data may have been captured from each sensor 113 over the predefined set of locations and/or the predefined area. In an illustrative embodiment, the sensor event data may include a latitude, a longitude, a signal intensity measurement value, the sensor number indicator, etc.

In an operation 214, a fifth indicator may be received that indicates a filtering variable associated with each sensor measurement included in the read, new sensor data. For example, the fifth indicator indicates a variable to use by name, column number, etc. In an alternative embodiment, the fifth indicator may not be received. For example, the last column in the read, new sensor data may be used automatically. In an illustrative embodiment, the filtering variable is the emission source flag value.

In an operation 216, a sixth indicator of a filtering value f may be received. In an alternative embodiment, the sixth indicator may not be received. For example, a default value may be stored, for example, in computer-readable medium 108 and used automatically. In another alternative embodiment, the value of the filtering value f may not be selectable. Instead, a fixed, predefined value may be used. For illustration, a default value for the filtering value f may be f=1 though other values may be used. The filtering value f may be used to filter the new sensor data to include sensor measurements from electrical equipment that is being monitored. In an illustrative embodiment, the filtering variable is the emission source flag value that has a value of one when the emission source is determined to be from equipment that is being monitored.

In an operation 218, the read, new sensor data is filtered using the filtering value f of the filtering variable indicated in operation 214 to select sensor measurements that are from equipment that is being monitored. For example, only sensor measurements having the emission source flag value of one may be selected from the new sensor data.

In an operation 220, a seventh indicator may be received that indicates a drop variable p associated with each sensor measurement included in the read, new sensor data. For example, the seventh indicator indicates a variable to use by name, column number, etc. In an alternative embodiment, the seventh indicator may not be received. For example, the last column in the read, new sensor data may be used automatically. In an illustrative embodiment, the drop variable p is the signal intensity measurement value.

In an operation 222, an eighth indicator of a drop threshold value T may be received. In an alternative embodiment, the eighth indicator may not be received. For example, a default value may be stored, for example, in computer-readable medium 108 and used automatically. In another alternative embodiment, the value of the drop threshold value T may not be selectable. Instead, a fixed, predefined value may be used. For illustration, a default value for the drop threshold value T may be T=1 though other values may be used. The drop threshold value T may be used to filter the new sensor data to include sensor measurements from electrical equipment that may be an emission source.

In an operation 224, the sensor data filtered in operation 218 is further filtered using the drop threshold value T and a drop value of the drop variable p indicated in operation 220 to select sensor measurements with a sufficiently high signal intensity value to indicate a possible emission source. For example, only sensor measurements having $p_i \geq T$ are selected from the sensor data filtered in operation 218 where $p_i$ indicates the drop value of the drop variable p of an $i^{th}$ sensor measurement. Operations 218 and 224 may be performed together to filter the new sensor data.

In an operation 226, a ninth indicator of a grouping distance value g may be received. In an alternative embodiment, the ninth indicator may not be received. For example, a default value may be stored, for example, in computer-readable medium 108 and used automatically. In another alternative embodiment, the value of the grouping distance value g may not be selectable. Instead, a fixed, predefined value may be used. For illustration, a default value for the grouping distance value g may be g=150 though other values may be used. In an illustrative embodiment, the grouping distance value g is defined in meters. The grouping distance value g is used to group the new sensor data to include sensor measurements within the grouping distance value g in a single cluster. For illustration, the grouping distance value g may be selected based on the detection range of the sensor detecting the signal intensity.

In an operation 228, the sensor data filtered in operation 224 are grouped into clusters having a diameter defined by the grouping distance value g. For example, the latitude and the longitude associated with each sensor measurement included in the sensor data filtered in operation 224 are converted to X, Y, Z coordinates in ECEF coordinate system so that a Euclidean distance can be used to perform the grouping. An altitude may be assumed. For example, sea level may be assumed or another predefined value may be used to compute the X, Y, Z coordinates for each sensor measurement in the ECEF coordinate system.

For illustration, a FASTCLUS procedure included in SAS/STAT® 9.22 may be used to cluster the sensor data filtered in operation 224 into clusters such that each sensor measurement is assigned to a single cluster with each cluster having a size defined by the grouping distance value g. For example, a radius option value for the FASTCLUS procedure may be defined to have the grouping distance value g so that each cluster is separated by the grouping distance value g. A maximum number of clusters may be selected to ensure that the predefined set of locations can be completely covered based on the grouping distance value g. The FASTCLUS procedure outputs a number of clusters, a centroid location for each cluster that includes at least one sensor measurement, a list of the sensor measurements included in each cluster, etc. For illustration, operations 218, 224, and 228 may include the functions described previously for detect events process 1022.

In an operation 230, the data grouped in operation 228 are stored as sensor event data. The data may be stored in computer-readable medium 108. The sensor event data also includes filtered, grouped sensor measurements from previous time periods. For example, the data grouped in operation 228 may be appended to data grouped and filtered from previous time periods. For illustration, data filtered from previous weeks/months/years may be stored in the sensor event data.

Figure 3:
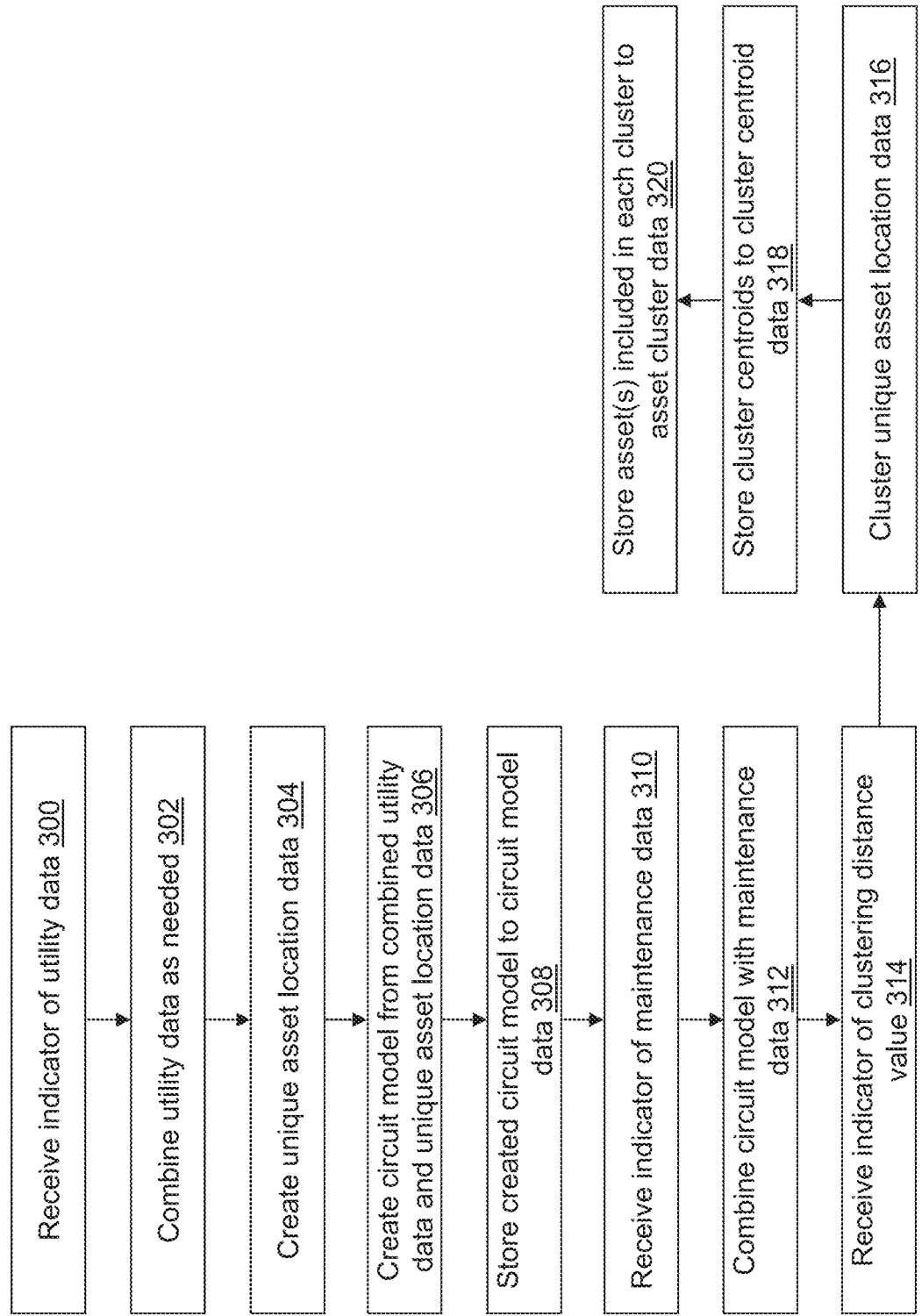
FIG. 3 depicts a flow diagram illustrating examples of operations performed by a utility data transformation application of the data analysis device of FIG. 1 in accordance with an illustrative embodiment.

Referring to FIG. 3, example operations associated with utility data transformation application 122 are described. Additional, fewer, or different operations may be performed depending on the embodiment of utility data transformation application 122. The order of presentation of the operations of FIG. 3 is not intended to be limiting. Some of the operations may not be performed in some embodiments. Although some of the operational flows are presented in sequence, the various operations may be performed in various repetitions and/or in other orders than those that are illustrated. For example, a user may execute utility data transformation application 122, which causes presentation of a second user interface window, which may include a plurality of menus and selectors such as drop-down menus, buttons, text boxes, hyperlinks, etc. associated with utility data transformation application 122 as understood by a person of skill in the art. The plurality of menus and selectors may be accessed in various orders. The operations of utility data transformation application 122 further may be performed in parallel using a plurality of threads and/or a plurality of worker computing devices. The first user interface and the second interface may be the same or different user interfaces.

In an operation 300, a tenth indicator may be received that indicates utility data. The utility data may be stored in one or more datasets. For example, the tenth indicator indicates a location and a name of one or more datasets that store the utility data. As an example, the tenth indicator may be received by utility data transformation application 122 after selection from a user interface window or after entry by a user into a user interface window. In an alternative embodiment, the utility data may not be selectable. For example, a most recently created dataset may be used automatically. The utility data may be updated when it is modified.

In an illustrative embodiment, the utility data may include datasets that describe electrical grid devices such as a dataset that describes transformers, a dataset that describes protective devices such as fuses, switches, reclosers, lightning arrestors, etc., a dataset that describes poles, etc. The data may be organized into one or more datasets. In general, each dataset includes a device identifier, a device type (e.g., transformer, pole, fuse, recloser, switch), a device size, a device phase, an upline device, a downline device, a last service date, a number of customers served, a latitude, a longitude, connectivity details, etc. The utility data may be transformed from utility GIS into standardized formats.

In an operation 302, the utility data may be combined to create an entire circuit layout that may include circuit nodes indicating wire connections between devices such as poles, transformers, overhead lines, fuses, etc. The utility data may be transformed into a standardized format.

In an operation 304, unique asset location data is created from the combined utility data to combine devices that may be located together, for example on a common pole. For example, a unique location identifier may be created by adjusting the longitude and latitude to 0.000000000 precision and concatenating the numerical values to character key value to create a common location identifier for devices and components in the same location. Using the unique location identifier, many devices and components can be grouped and identified using a single geographical point.

In an operation 306, a circuit model is created from the combined utility data. The circuit model may be created using the OPTNET procedure included with SAS/ORO 15.2 or the SAS NETWORK procedure. Biconnected components and articulation points may be determined using the BICONCOMP statement of the OPTNET procedure. For example, the circuit model may be created using build circuit model process 1010. The circuit model may be created based on the location and connectivity between devices using the upline and/or downline device indicators and respective geodetic location.

A biconnected component of a graph is a connected subgraph that cannot be broken into disconnected pieces by deleting any single node and its incident links. An articulation point is a node of a graph whose removal would cause an increase in the number of connected components. Articulating points can identify the longitude and latitude closest to a troubled electrical device to help determine the impact of an outage of each grid device. The circuit model may include a device identifier, a device type (e.g., transformer, pole, fuse, recloser, switch), a device size, a device phase, an upline device, a downline device, a last service date, a number of customers served, a latitude, a longitude, connectivity detail, articulating point indicating node for multiple connections, etc.

In an operation 308, the created circuit model is stored to circuit model data.

In an operation 310, an eleventh indicator may be received that indicates maintenance data 1002. For example, the eleventh indicator indicates a location and a name of maintenance data 1002 that includes an outage history associated with the electrical grid being monitored. As an example, the eleventh indicator may be received by utility data transformation application 122 after selection from a user interface window or after entry by a user into a user interface window. In an alternative embodiment, maintenance data 1002 may not be selectable. For example, a most recently created dataset may be used automatically. The maintenance data 1002 may be updated when it is modified.

In an illustrative embodiment, maintenance data 1002 may include maintenance and outage records relative to devices being recorded to provide a historical reference for the state of the electrical grid devices. For each device that experienced an outage, maintenance data 1002 may include a device identifier, a timestamp, an outage duration, a number of customers affected, an outage type code, an outage start time, an outage stop time, etc. The outage type code may indicate the cause of the outage.

In an operation 312, the circuit model is combined with maintenance data 1002 to associate an outage history with a device to create a historical reference of a device and gauge a propensity of a device to fail.

In an operation 314, a twelfth indicator of a clustering distance value a may be received. In an alternative embodiment, the twelfth indicator may not be received. For example, a default value may be stored, for example, in computer-readable medium 108 and used automatically. In another alternative embodiment, the value of the clustering distance value a may not be selectable. Instead, a fixed, predefined value may be used. For illustration, a default value for the clustering distance value a may be a=150 though other values may be used. In an illustrative embodiment, the clustering distance value a is defined in meters. The clustering distance value a is used to group the utility assets within the clustering distance value a in a single cluster. For illustration, the clustering distance value a may be selected based on the detection range of the sensor detecting the signal intensity. The clustering distance value a and the grouping distance value g may have the same value or the same parameter may be used for both.

In an operation 316, the unique asset location data created in operation 304 are grouped into clusters having a diameter defined by the clustering distance value a. For example, the latitude and the longitude associated with each grid asset included in the unique asset location data may be converted to X, Y, Z coordinates in the ECEF coordinate system so that a Euclidean distance can be used to perform the clustering. An altitude may be assumed. For illustration, the FASTCLUS procedure included in SAS/STAT® 9.22 may be used to cluster the unique asset location data created in operation 304 into clusters having a size defined by the clustering distance value a. For example, a radius option value for the FASTCLUS procedure may be defined to have the clustering distance value a so that each cluster is separated by the clustering distance value a. A maximum number of clusters may be selected to ensure that the predefined set of locations can be covered based on the clustering distance value a.

In an operation 318, a cluster centroid of each cluster defined in operation 316 may be stored as asset cluster centroid data. The data may be stored in computer-readable medium 108. The cluster centroids may be converted from ECEF to a geodetic coordinate system for plotting on a map. The cluster centroids may include the source identifier, a latitude, and a longitude. The source identifier uniquely identifies each asset cluster. The cluster centroid may be a weighted cluster centroid using a number of assets as a weight variable based on the unique location identifier. For example, a transmission pole with three devices having the same geodetic location has a weight of four for that unique location identifier. The weighted cluster centroid enables a centroid of the cluster to be closer to a location with more grid devices, which is useful in rural areas where grid devices are further apart.

In an operation 320, utility assets included in each cluster are stored to asset cluster data. The asset cluster data may include the source identifier, a device identifier, a latitude, a longitude, a device type, an upline device, a downline device, a number of customers served, etc.

Figure 4:
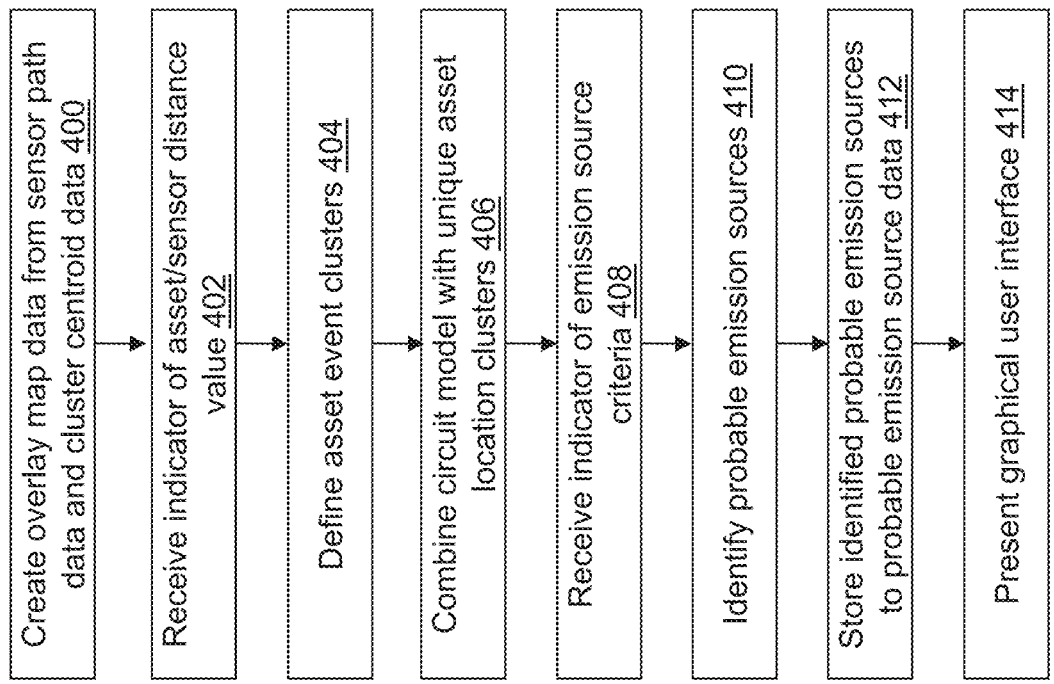
FIG. 4 depicts a flow diagram illustrating examples of operations performed by a data analysis application of the data analysis device of FIG. 1 in accordance with an illustrative embodiment.

Referring to FIG. 4, example operations associated with data analysis application 126 are described. Additional, fewer, or different operations may be performed depending on the embodiment of data analysis application 126. The order of presentation of the operations of FIG. 4 is not intended to be limiting. Some of the operations may not be performed in some embodiments. Although some of the operational flows are presented in sequence, the various operations may be performed in various repetitions and/or in other orders than those that are illustrated. For example, a user may execute data analysis application 126, which causes presentation of third user interface window 500 (shown referring to FIGS. 5, 6, 7, 8A, 8A (continued), 8B, and 8B (continued)), which includes a plurality of menus and selectors such as drop-down menus, buttons, text boxes, hyperlinks, etc. associated with data analysis application 126 as understood by a person of skill in the art. The plurality of menus and selectors may be accessed in various orders. The operations of data analysis application 126 further may be performed in parallel using a plurality of threads and/or a plurality of worker computing devices.

In an operation 400, overlay map data is created by combining the sensor path data with the asset cluster data to show a path of vehicle mounted sensors within a utility's assets region to compute miles covered by the sensor path. For example, the overlay map data may be created using define map overlay process 1018.

In an operation 402, a twelfth indicator of an asset/sensor distance value s may be received. In an alternative embodiment, the twelfth indicator may not be received. For example, a default value may be stored, for example, in computer-readable medium 108 and used automatically. In another alternative embodiment, the value of the asset/sensor distance value s may not be selectable. Instead, a fixed, predefined value may be used. For illustration, a default value for the asset/sensor distance value s may be s=150 though other values may be used. In an illustrative embodiment, the asset/sensor distance value s is defined in meters. The asset/sensor distance value s is used to identify grid devices that may be associated with sensor measurements. For illustration, the asset/sensor distance value s may be selected based on the detection range of the sensor detecting the signal intensity.

In an operation 404, unique asset location clusters are defined that include sensor events by joining the sensor data with the asset cluster data and only selecting an asset cluster within the asset/sensor distance value s of the sensor event location. For example, the distances may be calculated using the SAS GEODIST function to define a list of asset cluster centroids that are within the asset/sensor distance value s of a sensor event included in the sensor event data. For illustration, the unique asset location clusters may be defined using location matching process 1024.

In an operation 406, the created circuit model is combined with the defined unique asset location clusters using a database join function and the unique asset location identifier to add grid device details to each sensor event to define possible emission sources.

In an operation 408, a thirteenth indicator of an emission source criterion may be received. In an alternative embodiment, the thirteenth indicator may not be received. For example, a default value may be stored, for example, in computer-readable medium 108 and used automatically. In another alternative embodiment, the value of the emission source criterion may not be selectable. Instead, a fixed, predefined value may be used. For illustration, a default value for the emission source criterion may be identification of an event in at least a predefined number of route traversals. The emission source criterion is used to identify grid devices that are probable emission sources of the sensor measurements such as the RF emissions.

In an operation 410, probable emission sources are identified by traversing the possible emission sources and applying the emission source criterion. For illustration, the probable emission sources may be identified using determine emission source status process 1026. For example, if the data that generated the possible emission sources was captured over a four-week time period, the emission source criterion may require that a probable emission source have been identified as a possible emission source three times during the four-week time period where a route traversal was performed once per week.

The identified probable emission source(s) may be provided as input devices for processing using the methods/systems described in U.S. Pat. No. 11,322,976 that issued May 3, 2022. The identified probable emission source(s) may be prioritized based on a number of customers that would be affected if the grid device were to fail triggering an outage and/or based on whether the grid device is a protective device such as a lightning arrestor as described previously for prioritize assets process 1028.

In an operation 412, the identified probable emission sources are stored to emission source data. The identified probable emission sources may be split into two different datasets where one dataset includes all of the identified probable emission sources and a second dataset includes only the most recent identified probable emission sources. For example, the most recent time period may be based on the most recent four weeks of data.

In an operation 414, third user interface window 500 is presented under control of data analysis application 126 that may be integrated with utility data transformation application 122 and/or with sensor data transformation application 124. For example, the first user interface window, the second user interface window, and third user interface window 500 may form a single user interface. Third user interface window 500 may be presented at any point in the operations of data analysis application 126, utility data transformation application 122, and sensor data transformation application 124. Selections made using third user interface window 500 may trigger the data transformation and/or data analysis as understood by a person of skill in the art.

The one or more output datasets 128 may include one or more of the sensor path data, the sensor event data, the circuit model data, the cluster centroid data, the asset cluster data, the probable emission source data, etc.

Figure 5:
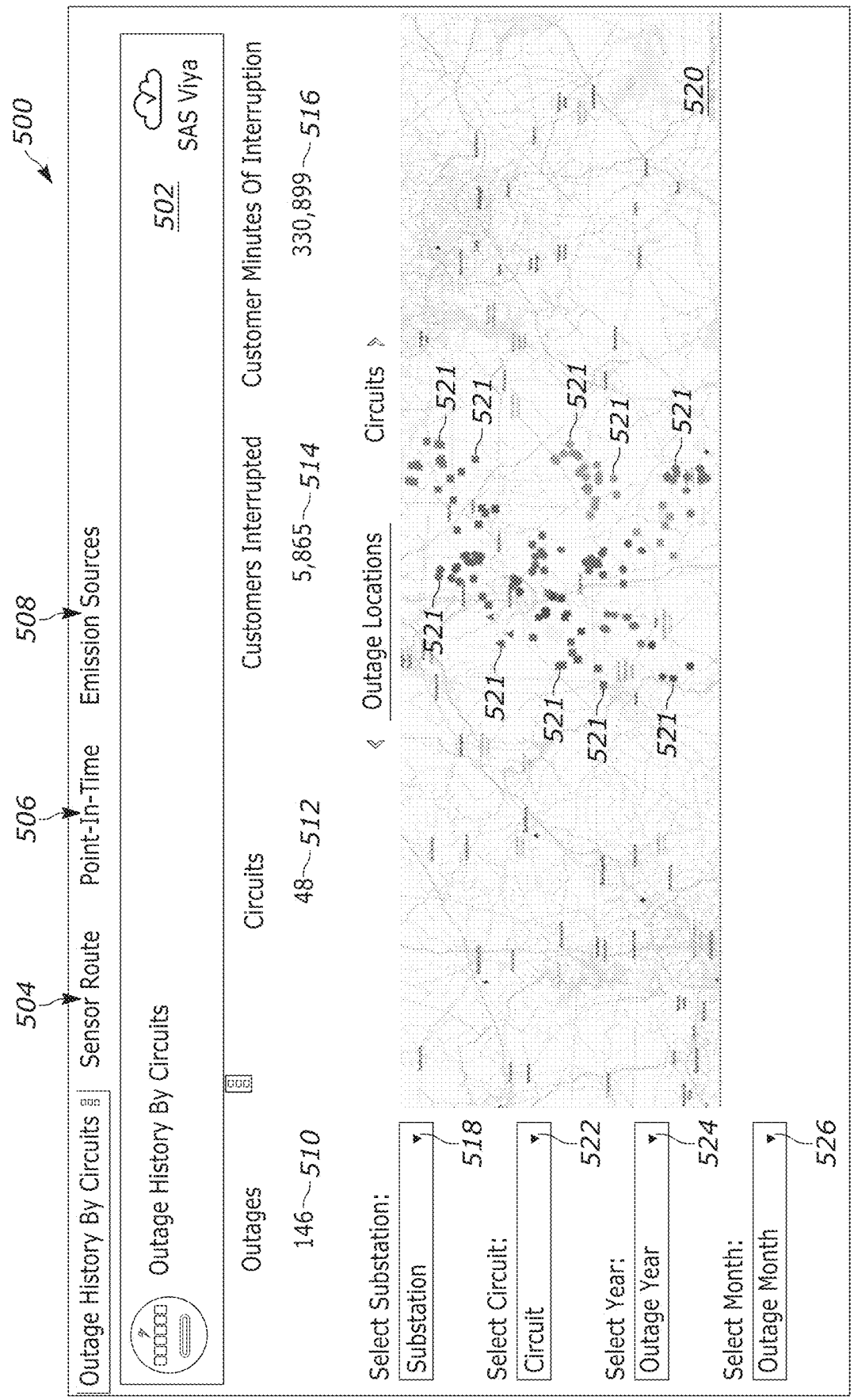
FIG. 5 shows a graphical user interface (GUI) presenting outage history information using data generated by the data analysis device of FIG. 1 in accordance with an illustrative embodiment.

Referring to FIG. 5, third user interface window 500 is shown presenting outage history information using the circuit model combined with maintenance data 1002 in operation 312 of utility data transformation application 122 in accordance with an illustrative embodiment. For example, third user interface window 500 may be presented in the SAS Visual Analytics dashboard. The outage history information may be presented by user selection of outage history tab 502. Third user interface window 500 may further include vehicle route tab 504, point in time tab 506, and probable emission source tab 508.

Outage history tab 502 shows where equipment failures have been seen historically to establish an understanding of poor-performing regions. Outage history tab 502 also shows a historical median time to repair for failed assets using a total number of customers affected and CMI.

In an illustrative embodiment, outage history tab 502 may include a number of outages indicator 510, a number of circuits indicator 512, a number of customers affected indicator 514, a CMI indicator 516, a substation selector 518, an outage map 520, a circuit selector 522, a year selector 524, and a month selector 526. The articulating points and connected subgraphs may be used to calculate the impact of an outage.

Number of outages indicator 510 shows a number of the grid devices that experienced an outage during the time period included in maintenance data 1002. For example, the number of assets may be computed by counting the number of unique grid devices included in maintenance data 1002. Number of circuits indicator 512 shows a number of the grid circuits that experienced an outage during the time period included in maintenance data 1002. Number of customers affected indicator 514 shows a number of customers that experienced an outage during the time period included in maintenance data 1002. For example, the number of customers that experienced an outage during the time period may be computed from the number of customers affected included in maintenance data 1002. Number of CMI indicator 516 shows the CMI experienced during the time period included in maintenance data 1002.

Substation selector 518 may be a drop-down selector with a list of the distinct substations identified in the utility data (gird data 1000 and/or maintenance data 1002) and included in the circuit model. The user can select a substation from the drop-down list to trigger presentation of the circuit model that includes the grid devices connected through the substation associated with the selected substation on outage map 520.

Outage map 520 includes a map of the area that includes the grid devices included in the circuit model. The map may be created using GIS mapping software such as ArcGIS provided by ESRI headquartered in Redlands, CA, USA. Referring to FIG. 5, outage map 520 shows grid device outage locations 521. Each grid device outage location symbol of the grid device outage locations 521 indicates a grid device that experienced an outage using different symbols and/or colors. For simplicity, not all of the grid device outage locations are indicated using reference number 521. The distinct colors may be used to indicate the substation to which the grid devices are connected such that a common color indicates a common substation. Outage map 520 may be zoomed in or out, panned up, down, to the left or right, etc.

Circuit selector 522 may be a drop-down selector with a list of the distinct circuits identified in the utility data and included in the circuit model. The user can select a circuit from the drop-down list to trigger presentation of the circuit model that includes the grid devices connected by the circuit associated with the selected circuit on outage map 520.

Year selector 524 includes a list of years from which the user can select. The selected year acts as a filter to modify the grid devices presented in outage map 520.

Month selector 526 includes a list of months from which the user can select. The selected month acts as a filter to modify the grid devices presented in outage map 520. Each month may be associated with a most recent month in the selected year.

Figure 6:
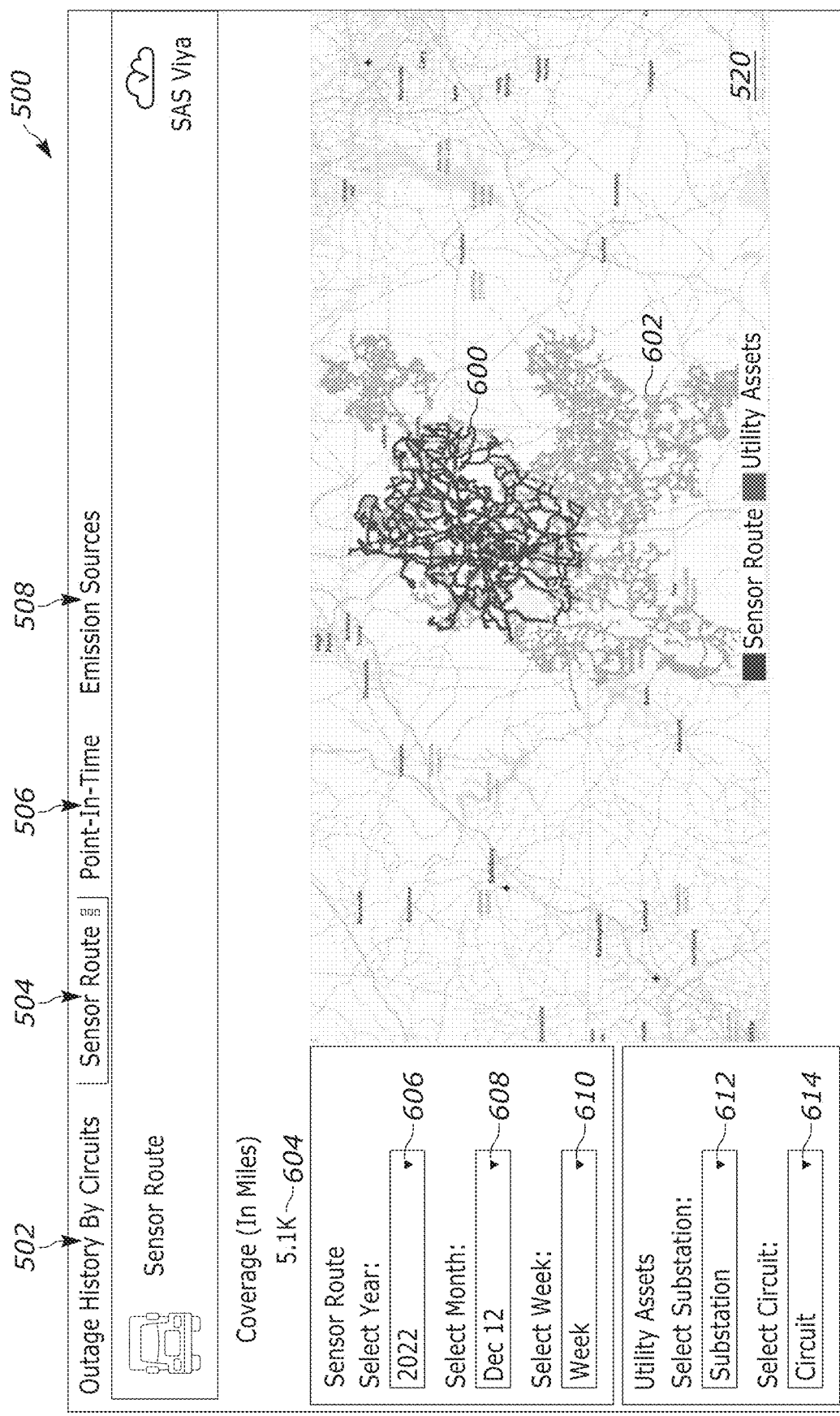
FIG. 6 shows a GUI presenting a sensor route overlaid on grid device locations using data generated by the data analysis device of FIG. 1 in accordance with an illustrative embodiment.

Referring to FIG. 6, vehicle route tab 504 of third user interface window 500 is shown presenting the overlay map data generated by data analysis application 126 in operation 400 in accordance with an illustrative embodiment. Vehicle route tab 504 shows how well the circuit is covered by the sensor(s) mounted on vehicles. Vehicle route tab 504 may include outage map 520, a coverage indicator 604, a year selector 606, a month selector 608, a week selector 610, a substation selector 612, and a circuit selector 614. Outage map 520 shows vehicle routes 600 generated using the sensor path data overlaid on grid device clusters 602 generated using the cluster centroid data.

Coverage indicator 604 shows the number of miles traveled by the vehicles as defined by vehicle routes 600. Year selector 606 includes a list of years from which the user can select. The year selected using year selector 606 acts as a filter to modify the vehicle routes 600 presented in outage map 520 to the selected year.

Month selector 608 includes a list of months from which the user can select. The month selected using month selector 608 acts as a filter to modify the vehicle routes 600 presented in outage map 520 to the selected month of the selected year.

Week selector 610 includes a list of weeks from which the user can select. The week selected using week selector 610 acts as a filter to modify the vehicle routes 600 presented in outage map 520 to the selected week of the selected month and year.

Substation selector 612 includes a list of substations from which the user can select. The substation selected using substation selector 612 acts as a filter to modify the grid device clusters 602 presented in outage map 520 to the selected substation.

Circuit selector 614 includes a list of circuits from which the user can select. The circuit selected using circuit selector 614 acts as a filter to modify the grid device clusters 602 presented in outage map 520 to the selected circuit.

Figure 7:
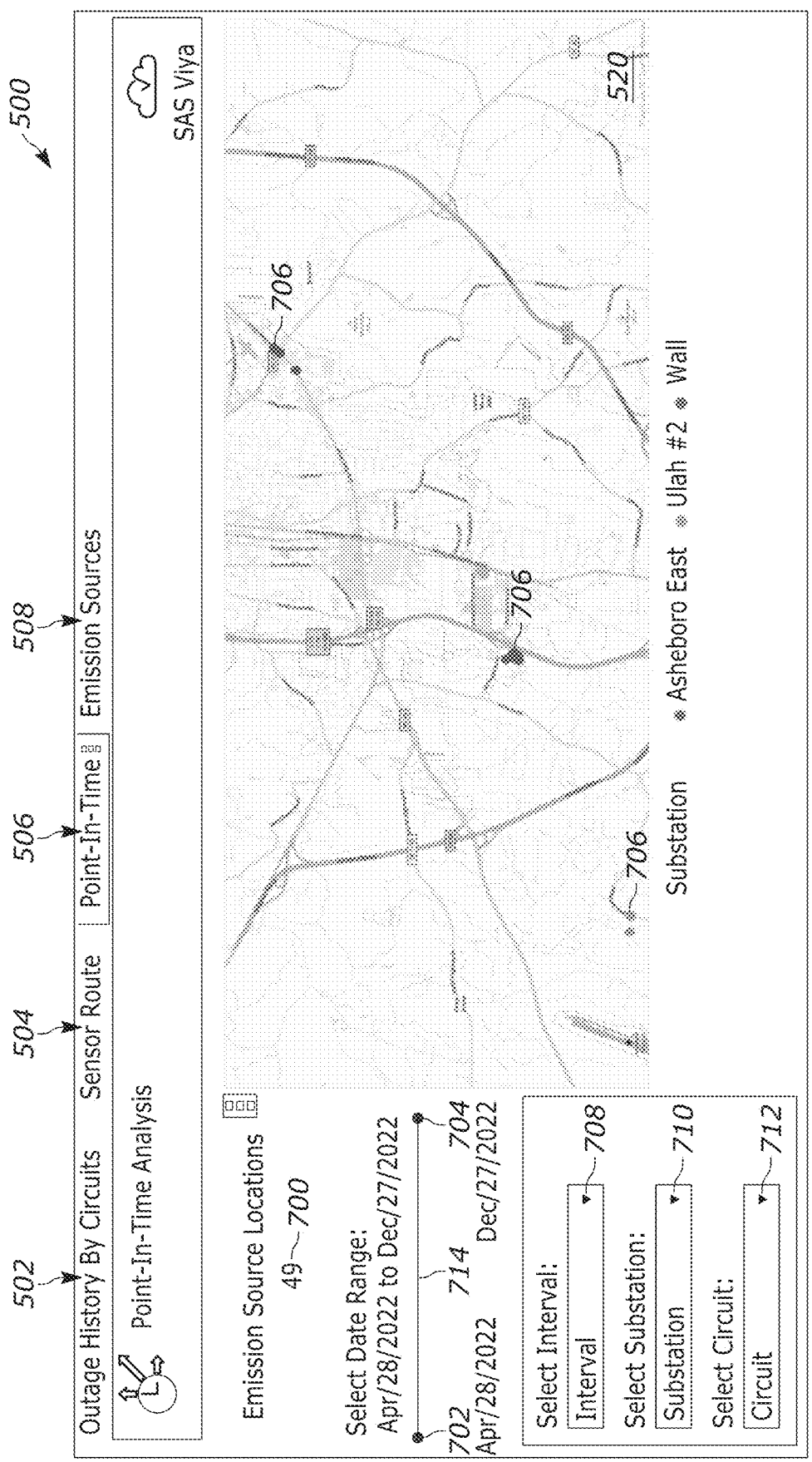
FIG. 7 shows a GUI presenting a point in time analysis of probable emission sources using data generated by the data analysis device of FIG. 1 in accordance with an illustrative embodiment.

Referring to FIG. 7, point in time tab 506 of third user interface window 500 is shown presenting all of the probable emission source data generated by data analysis application 126 in operation 412 in accordance with an illustrative embodiment. Point in time tab 506 shows potential issues over time and includes the ability to look back in time to assess the health of the grid. Point in time tab 506 can also be used to show maintenance activities that have been resolved by looking at a time period before the maintenance activity took place and a time period after. Point in time tab 506 can also be used to show how an unexpected event such as a strong thunderstorm impacted the circuit assets. Some of these can be transient effects from the storm that disappear in a few days.

Point in time tab 506 includes outage map 520, a number of probable emission sources indicator 700, a start date selector 702, a stop date selector 704, a time interval selector 708, a substation selector 710, and a circuit selector 712. Outage map 520 shows probable emission source locations 706 using symbols in the illustrative embodiment. The symbols may be color coded to indicate an associated substation. Number of probable emission sources indicator 700 indicates a number of probable emission sources based on the selections using start date selector 702, stop date selector 704, time interval selector 708, substation selector 710, and circuit selector 712. Start date selector 702 may be selected and dragged along a timeline 714 to change the start date for selecting the probable emission sources shown with a symbol in outage map 520 and included in number of probable emission sources indicator 700. Start date selector 702 may be defined initially based on an earliest timestamp in the probable emission source data. Stop date selector 704 may be selected and dragged along timeline 714 to change the stop date for selecting the probable emission sources shown with a symbol in outage map 520 and included in number of probable emission sources indicator 700. Stop date selector 704 may be defined initially based on a last timestamp in the probable emission source data.

Time interval selector 708 includes a list of time intervals from which the user can select. The time interval selected using time interval selector 708 acts as a filter to modify the possible emission sources presented in outage map 520 to the selected time interval. Illustrative time intervals may include a most recent week, a most recent month, a most recent year, etc.

Substation selector 710 includes a list of substations from which the user can select. The substation selected using substation selector 710 acts as a filter to modify the possible emission sources presented in outage map 520 to the selected substation.

Circuit selector 712 includes a list of circuits from which the user can select. The circuit selected using circuit selector 712 acts as a filter to modify the possible emission sources presented in outage map 520 to the selected circuit.

Figure 8A:
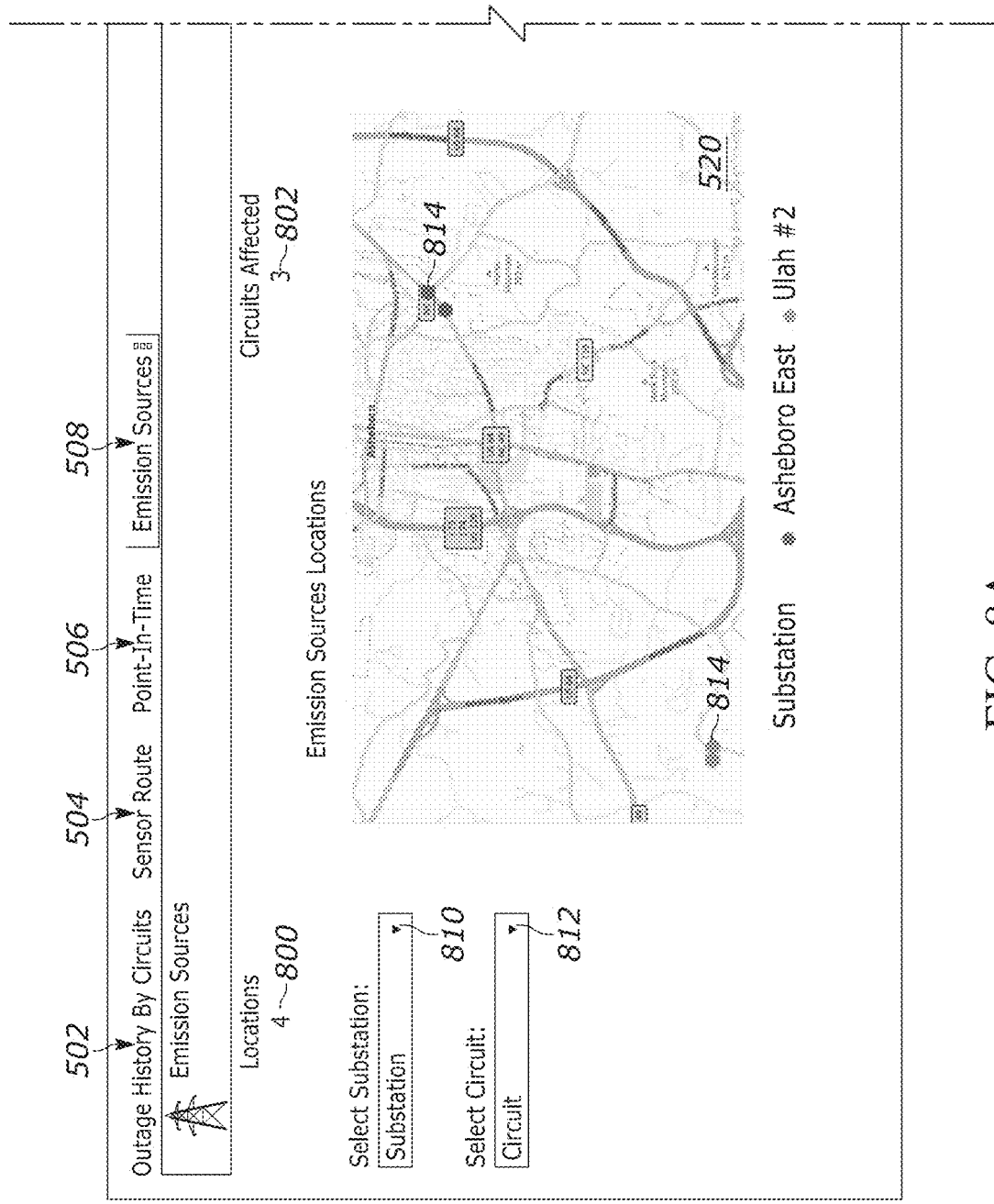
FIGS. 8A, 8A (continued), 8B, and 8B (continued) show a GUI presenting current probable emission sources using data generated by the data analysis device of FIG. 1 in accordance with an illustrative embodiment.

Referring to FIGS. 8A, 8A (continued), 8B, and 8B (continued), probable emission source tab 508 of third user interface window 500 is shown presenting current probable emission source data generated by data analysis application 126 in operation 412 in accordance with an illustrative embodiment. Probable emission source tab 508 shows a prioritized asset event listing of current issues to be addressed and can be used to prioritize a dispatch of workers to resolve the issues prior to any power interruption.

Probable emission source tab 508 includes outage map 520, a number of probable emission sources indicator 800, a number of affected circuits indicator 802, a number of possible customers affected indicator 804, a CMI indicator 806, an emission source table 808, a substation selector 810, and a circuit selector 812. Outage map 520 shows probable emission source locations 814.

Number of probable emission sources indicator 800 indicates a number of probable emission sources based on the selections using substation selector 810 and circuit selector 812. Number of affected circuits indicator 802 indicates a number of circuits that would be affected if the probable emission source(s) experience a failure leading to an outage. Number of possible customers interrupted indicator 804 indicates a number of customers that would be affected if the probable emission source(s) experience a failure leading to an outage. CMI 806 indicates an estimated CMI if the probable emission source(s) experience a failure leading to an outage.

Emission source table 808 (shown referring to FIG. 8A (continued)) includes a row that describes each grid device associated with each probable emission source. In the illustrative embodiment, columns of emission source table 808 include the source identifier (Group ID) that shows the asset cluster number for the grid device as defined in the asset cluster data of operation 320, a substation identifier to which the grid device is connected, a circuit to which the grid device is connected, the number of affected customers if the assets associated with the source identifier fail (CI), and the CMI if the assets associated with the source identifier fail.

Figure 8B:
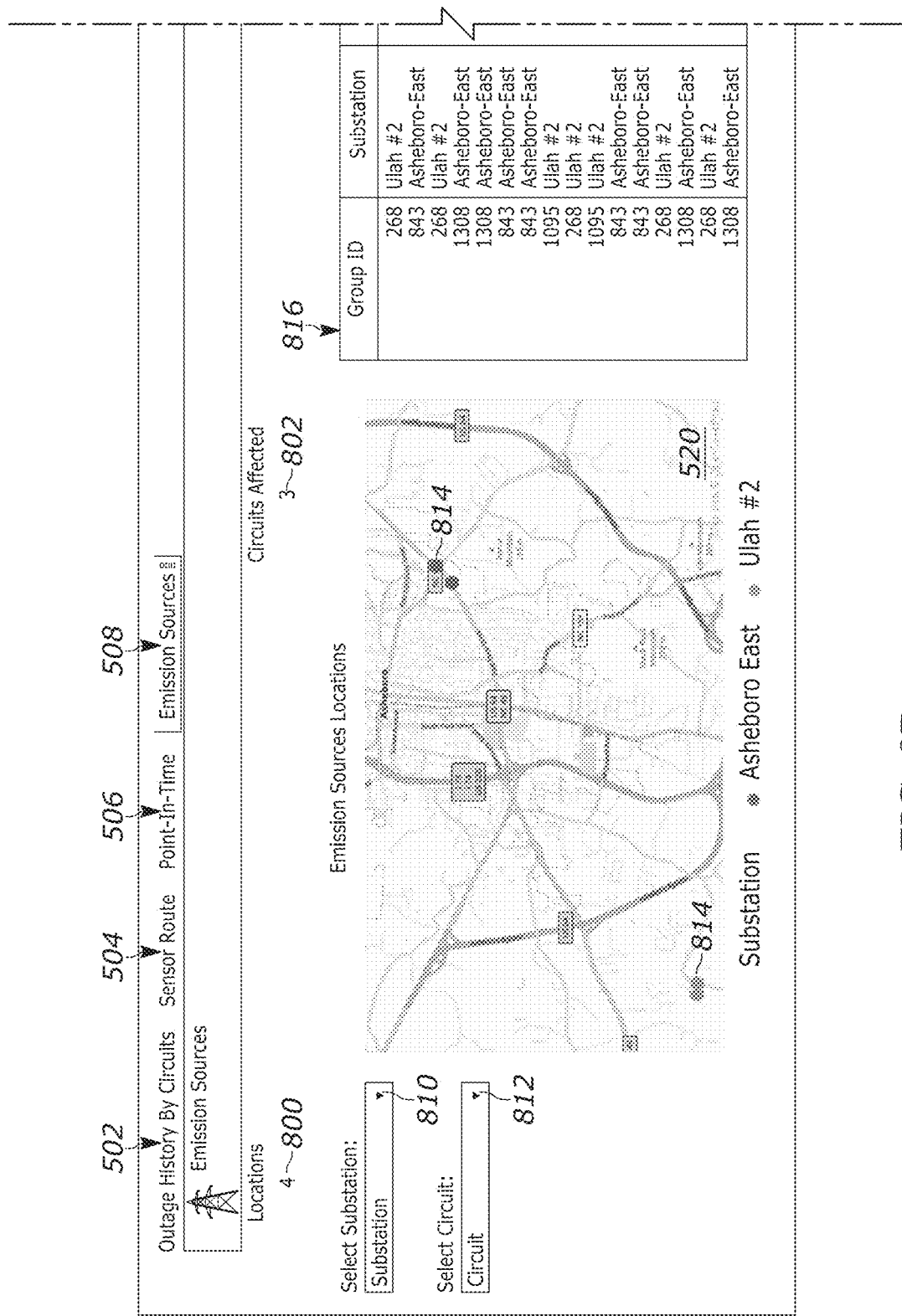

Referring to FIGS. 8B and 8B (continued), an asset event list table 816 may be selected instead of emission source table 808. Asset event list table 816 includes a row that describes each grid device associated with each probable emission source. In the illustrative embodiment, columns of probable emission source table 808 include the source identifier (Group ID), the substation identifier, a circuit, a device identifier (Asset ID), a grid device type (Asset Type), the number of affected customers if the assets associated with the source identifier fail (CI), the CMI, and a grid device description (Asset Description).

The rows of emission source table 808 and asset event list table 816 may be prioritized based on the number of affected customers and/or the CMI if the grid device failed and/or on the grid device type. For example, grid device types that are protective devices may be prioritized higher in probable emission source table 808 and asset event list table 816 regardless of the number of affected customers and/or the CMI.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more". Still further, using "and" or "or" in the detailed description is intended to include "and/or" unless specifically indicated otherwise. The illustrative embodiments may be implemented as a method, apparatus, or article of manufacture using standard programming and/or engineering techniques to produce software, firmware, hardware, or any combination thereof to control a computer to implement the disclosed embodiments.

The foregoing description of illustrative embodiments of the disclosed subject matter has been presented for purposes of illustration and of description. It is not intended to be exhaustive or to limit the disclosed subject matter to the precise form disclosed, and modifications and variations are possible in light of the above teachings or may be acquired from practice of the disclosed subject matter. The embodiments were chosen and described in order to explain the principles of the disclosed subject matter and as practical applications of the disclosed subject matter to enable one skilled in the art to utilize the disclosed subject matter in various embodiments and with various modifications as suited to the particular use contemplated.

What is claimed is:

1. A non-transitory computer-readable medium having stored thereon computer-readable instructions that when executed by a computing device cause the computing device to:

(A) cluster sensor data using a predefined grouping distance value to define one or more sensor event clusters, wherein the sensor data includes a plurality of sensor measurements, wherein each sensor measurement of the plurality of sensor measurements includes a signal intensity measurement value, a location of a sensor when the signal intensity measurement value was determined by the sensor, and a time that the signal intensity measurement value was determined by the sensor, wherein the signal intensity measurement value is measured for a signal emitted by a monitored device, wherein each sensor measurement is assigned to a single sensor event cluster with each sensor event cluster having a size defined by the predefined grouping distance value;

(B) cluster a plurality of monitored devices using a predefined clustering distance value to define one or more asset clusters, wherein the monitored device is one of the plurality of monitored devices, wherein each monitored device is assigned to a single asset cluster with each asset cluster having a size defined by the predefined clustering distance value, wherein a location is associated with each monitored device of the plurality of monitored devices;

(C) compute a distance between each sensor event cluster and each asset cluster;

(D) when the computed distance is less than or equal to a predefined asset/sensor distance value for a sensor event cluster and an asset cluster, add an asset identifier of the asset cluster associated with the computed distance to an asset event list; and (E) for each asset cluster included in the asset event list, show an asset location of an asset on a map in a graphical user interface presented in a display, wherein the asset location is associated with the asset identifier of a respective asset cluster included in the asset event list.

2. The non-transitory computer-readable medium of claim 1, wherein the distance is computed using a Euclidean distance function.

3. The non-transitory computer-readable medium of claim 2, wherein a location of each sensor event cluster is stored in geodetic coordinates that is converted to an earth-centered, earth-fixed coordinate (ECEF) system and a location of each asset cluster is stored in geodetic coordinates that is converted to the ECEF system before computing the distance.

4. The non-transitory computer-readable medium of claim 1, wherein the asset identifier indicates a single monitored device.

5. The non-transitory computer-readable medium of claim 1, wherein the asset identifier indicates the asset cluster that includes a plurality of monitored devices.

6. The non-transitory computer-readable medium of claim 1, wherein the predefined grouping distance value and the predefined asset/sensor distance value are defined based on a detection range of the sensor.

7. The non-transitory computer-readable medium of claim 1, wherein (A) through (D) are repeated for a plurality of time intervals, wherein a status flag is associated with each asset cluster for each time interval of the plurality of time intervals, wherein the status flag indicates active when a subset of monitored devices is included in a respective asset cluster, wherein the status flag indicates inactive when the subset of monitored devices is no longer included in the respective asset cluster for a predefined period of time.

8. The non-transitory computer-readable medium of claim 1, wherein the sensor is mounted on a vehicle that periodically travels a predefined route.

9. The non-transitory computer-readable medium of claim 1, wherein the asset location is a centroid of the respective asset cluster included in the asset event list.

10. The non-transitory computer-readable medium of claim 1, wherein the asset location is a weighted centroid of the respective asset cluster included in the asset event list, wherein a weight used to compute the weighted centroid is computed based on a number of monitored devices having a common location that are included in the respective asset cluster.

11. The non-transitory computer-readable medium of claim 1, wherein the computer-readable instructions further cause the computing device to:
create a circuit model of the plurality of monitored devices based on the location associated with each monitored device of the plurality of monitored devices and a connectivity between monitored devices determined using an upline or a downline device indicator defined for each monitored device of the plurality of monitored devices, wherein a monitored device identifier is associated with each monitored device of the plurality of monitored devices.

12. The non-transitory computer-readable medium of claim 11, wherein the computer-readable instructions further cause the computing device to:
read maintenance data for a second plurality of monitored devices, wherein the maintenance data includes a second monitored device identifier and outage information for an outage device of the second plurality of monitored devices associated with the second monitored device identifier;
identify an asset cluster of the one or more asset clusters that includes the monitored device having the monitored device identifier that matches the second monitored device identifier of the outage device; and
show an outage location of the identified asset cluster on the map in the graphical user interface presented in the display, wherein the outage location is associated with the asset identifier of the identified asset cluster.

13. The non-transitory computer-readable medium of claim 12, wherein the graphical user interface presented in the display includes a filter selector configured to filter the outage location of the identified asset cluster shown on the map.

14. The non-transitory computer-readable medium of claim 13, wherein the filter selector filters the outage location of the identified asset cluster based on one or more of a substation identifier, a circuit identifier, a year identifier, and a month identifier.

15. The non-transitory computer-readable medium of claim 12, wherein the graphical user interface presented in the display further includes an indicator, wherein the indicator indicates a number of outages, a number of circuits affected, a number of customers interrupted, or a number of customer minutes of interruption.

16. The non-transitory computer-readable medium of claim 15, wherein the number of customers interrupted and the number of customer minutes of interruption are determined based on the connectivity between monitored devices.

17. The non-transitory computer-readable medium of claim 11, wherein the computer-readable instructions further cause the computing device to:
show each asset location of the one or more asset clusters on the map in the graphical user interface presented in the display; and
overlay each event cluster location of the one or more sensor event clusters on the map in the graphical user interface presented in the display, wherein each event cluster location is a centroid of a respective sensor event cluster of the one or more sensor event clusters.

18. The non-transitory computer-readable medium of claim 1, wherein the graphical user interface presented in the display includes a filter selector configured to filter the asset location of the asset shown on the map.

19. The non-transitory computer-readable medium of claim 18, wherein the filter selector filters the asset location of the asset based on one or more of a substation identifier, a circuit identifier, a date range, and a time interval.

20. The non-transitory computer-readable medium of claim 18, wherein the graphical user interface presented in the display further includes a number of probable emission sources indicator that indicates a number of emission source locations.

21. The non-transitory computer-readable medium of claim 1, wherein the asset location of the asset shown on the map is identified within a predefined time period.

22. The non-transitory computer-readable medium of claim 21, wherein the graphical user interface presented in the display includes a filter selector configured to filter the asset location of the asset shown on the map.

23. The non-transitory computer-readable medium of claim 22, wherein the filter selector filters the asset location of the asset based on one or more of a substation identifier and a circuit identifier.

24. The non-transitory computer-readable medium of claim 21, wherein the graphical user interface presented in the display further includes a number of probable emission sources indicator that indicates a number of emission source locations, a number of circuits affected, a number of customers interrupted, or a number of customer minutes of interruption.

25. The non-transitory computer-readable medium of claim 21, wherein the graphical user interface presented in the display includes an emission source table, wherein the emission source table includes a row for each asset shown on the map.

26. The non-transitory computer-readable medium of claim 25, wherein the emission source table includes a column that indicates a substation identifier of a respective asset, a circuit identifier of the respective asset, a number of customers interrupted by the respective asset, or a number of customer minutes of interruption by the respective asset.

27. The non-transitory computer-readable medium of claim 26, wherein rows of the emission source table may be prioritized based on the number of customers interrupted by the respective asset.

28. The non-transitory computer-readable medium of claim 21, wherein the graphical user interface presented in the display includes an asset event list table, wherein the asset event list table includes a row for each monitored device of the plurality of monitored devices included in each asset cluster shown on the map.

29. A computing device comprising:
a processor; and
a computer-readable medium operably coupled to the processor, the computer-readable medium having computer-readable instructions stored thereon that, when executed by the processor, cause the computing device to
cluster sensor data using a predefined grouping distance value to define one or more sensor event clusters, wherein the sensor data includes a plurality of sensor measurements, wherein each sensor measurement of the plurality of sensor measurements includes a signal intensity measurement value, a location of a sensor when the signal intensity measurement value was determined by the sensor, and a time that the signal intensity measurement value was determined by the sensor, wherein the signal intensity measurement value is measured for a signal emitted by a monitored device, wherein each sensor measurement is assigned to a single sensor event cluster with each sensor event cluster having a size defined by the predefined grouping distance value;
cluster a plurality of monitored devices using a predefined clustering distance value to define one or more asset clusters, wherein the monitored device is one of the plurality of monitored devices, wherein each monitored device is assigned to a single asset cluster with each asset cluster having a size defined by the predefined clustering distance value, wherein a location is associated with each monitored device of the plurality of monitored devices;
compute a distance between each sensor event cluster and each asset cluster;
when the computed distance is less than or equal to a predefined asset/sensor distance value for a sensor event cluster and an asset cluster, add an asset identifier of the asset cluster associated with the computed distance to an asset event list; and
for each asset cluster included in the asset event list, show an asset location of an asset on a map in a graphical user interface presented in a display, wherein the asset location is associated with the asset identifier of a respective asset cluster included in the asset event list.

30. A method of monitoring a status of grid devices using sensor measurements, the method comprising:
clustering, by a computing device, sensor data using a predefined grouping distance value to define one or more sensor event clusters, wherein the sensor data includes a plurality of sensor measurements, wherein each sensor measurement of the plurality of sensor measurements includes a signal intensity measurement value, a location of a sensor when the signal intensity measurement value was determined by the sensor, and a time that the signal intensity measurement value was determined by the sensor, wherein the signal intensity measurement value is measured for a signal emitted by a monitored device, wherein each sensor measurement is assigned to a single sensor event cluster with each sensor event cluster having a size defined by the predefined grouping distance value;
clustering, by the computing device, a plurality of monitored devices using a predefined clustering distance value to define one or more asset clusters, wherein the monitored device is one of the plurality of monitored devices, wherein each monitored device is assigned to a single asset cluster with each asset cluster having a size defined by the predefined clustering distance value, wherein a location is associated with each monitored device of the plurality of monitored devices;
computing, by the computing device, a distance between each sensor event cluster and each asset cluster;
when the computed distance is less than or equal to a predefined asset/sensor distance value for a sensor event cluster and an asset cluster, adding, by the computing device, an asset identifier of the asset cluster associated with the computed distance to an asset event list; and
for each asset cluster included in the asset event list, showing, by the computing device, an asset location of an asset on a map in a graphical user interface presented in a display, wherein the asset location is associated with the asset identifier of a respective asset cluster included in the asset event list.

* * * * *